US011261519B2

(12) United States Patent
Moriguchi et al.

(10) Patent No.: US 11,261,519 B2
(45) Date of Patent: Mar. 1, 2022

(54) COATING FILM, MANUFACTURING METHOD THEREFOR, AND PVD APPARATUS

(71) Applicants: NIPPON ITF, INC., Kyoto (JP); NIPPON PISTON RING CO., LTD., Saitama (JP)

(72) Inventors: Hideki Moriguchi, Kyoto (JP); Akinori Shibata, Kyoto (JP); Takehiko Ooshiro, Kyoto (JP); Yoshihiro Ito, Saitama (JP); Takahiro Okazaki, Saitama (JP); Hiroyuki Sugiura, Saitama (JP)

(73) Assignees: NIPPON ITF, INC., Kyoto (JP); NIPPON PISTON RING CO., LTD., Saitama (JP)

( * ) Notice: Subject to any disclaimer, the term of this patent is extended or adjusted under 35 U.S.C. 154(b) by 630 days.

(21) Appl. No.: 16/062,109

(22) PCT Filed: Dec. 16, 2016

(86) PCT No.: PCT/JP2016/087612
§ 371 (c)(1),
(2) Date: Jun. 14, 2018

(87) PCT Pub. No.: WO2017/104822
PCT Pub. Date: Jun. 22, 2017

(65) Prior Publication Data
US 2018/0371608 A1 Dec. 27, 2018

(30) Foreign Application Priority Data

Dec. 18, 2015 (JP) .............................. JP2015-247841
Mar. 23, 2016 (JP) .............................. JP2016-058421

(51) Int. Cl.
C23C 14/06 (2006.01)
C23C 14/54 (2006.01)
(Continued)

(52) U.S. Cl.
CPC ............ *C23C 14/541* (2013.01); *B32B 9/007* (2013.01); *C23C 14/0605* (2013.01);
(Continued)

(58) Field of Classification Search
CPC .... C23C 14/046; C23C 14/0605; C23C 14/42
(Continued)

(56) References Cited

U.S. PATENT DOCUMENTS

2001/0031346 A1* 10/2001 Iwamura ............... C23C 28/046
428/336
2008/0220257 A1 9/2008 Dekempeneer
(Continued)

FOREIGN PATENT DOCUMENTS

EP 1992715 11/2008
EP 2505685 10/2012
(Continued)

OTHER PUBLICATIONS

"Office Action of Japan Counterpart Application", with English translation thereof, dated Aug. 8, 2018, p. 1-p. 6.
(Continued)

*Primary Examiner* — Archene A Turner
(74) *Attorney, Agent, or Firm* — JCIPRNET

(57) ABSTRACT

The purpose of the invention is to provide technology, which, in addition to being capable of forming thick hard carbon films of excellent durability even using PVD, is able to establish both chipping resistance and wear resistance in the formed hard carbon film and able to improve low friction properties and peeling resistance. Provided is a coating film to be coated on the surface of a substrate, the coating film
(Continued)

having a total film thickness of greater than 1 µm to 50 µm wherein: when a cross-section is observed using bright field TEM images, white hard carbon layers that are shown as relatively white and black hard carbon layers that are shown as black are alternately laminated in the thickness direction; and the white hard carbon layers have regions that have grown in a fan-shape in the thickness direction.

22 Claims, 6 Drawing Sheets

(51) Int. Cl.
    *F16J 9/26* (2006.01)
    *C23C 28/04* (2006.01)
    *B32B 9/00* (2006.01)
    *C23C 14/14* (2006.01)
    *C23C 14/32* (2006.01)
    *C23C 14/50* (2006.01)

(52) U.S. Cl.
    CPC ............ *C23C 14/14* (2013.01); *C23C 14/325* (2013.01); *C23C 14/505* (2013.01); *C23C 14/548* (2013.01); *C23C 28/044* (2013.01); *C23C 28/046* (2013.01); *F16J 9/26* (2013.01)

(58) Field of Classification Search
    USPC ......................................................... 428/408
    See application file for complete search history.

(56) References Cited

U.S. PATENT DOCUMENTS

| | | | |
|---|---|---|---|
| 2010/0239854 A1* | 9/2010 | Chen | C23C 16/26 428/336 |
| 2012/0248711 A1* | 10/2012 | Iwashita | C23C 28/044 277/444 |
| 2013/0221548 A1 | 8/2013 | Iwahori | |
| 2015/0292622 A1 | 10/2015 | Kennedy et al. | |
| 2017/0306257 A1* | 10/2017 | Moriguchi | C23C 14/0605 |
| 2019/0100434 A1* | 4/2019 | Moriguchi | C23C 14/54 |

FOREIGN PATENT DOCUMENTS

| | | |
|---|---|---|
| JP | H10087396 | 4/1998 |
| JP | H10226874 | 8/1998 |
| JP | 2001261318 | 9/2001 |
| JP | 2002322555 | 11/2002 |
| JP | 2002327271 | 11/2002 |
| JP | 2008001951 | 1/2008 |
| JP | 2009504448 | 2/2009 |
| JP | 2009184859 | 8/2009 |
| JP | 2011148686 | 8/2011 |
| JP | 2012527583 | 11/2012 |
| JP | 2013528697 | 7/2013 |
| JP | 2015063714 | 4/2015 |
| WO | 2012063735 | 5/2012 |
| WO | 2015115601 | 8/2015 |

OTHER PUBLICATIONS

"Office Action of China Counterpart Application," with English translation thereof, dated Sep. 29, 2019, p. 1-p. 11.
"International Search Report (Form PCT/ISA/210) of PCT/JP2016/087612," dated Jan. 24, 2017, with English translation thereof, pp. 1-4.
"Hearing Notice of India Counterpart Application", dated Jan. 22, 2021, with English translation thereof, pp. 1-2.
"Partial Supplementary Search Report of Europe Counterpart Application", dated Sep. 17, 2019, p. 1-p. 10.
"Search Report of Europe Counterpart Application", dated Jan. 2, 2020, p. 1-p. 9.
"Office Action of India Counterpart Application," with English translation thereof, dated Sep. 12, 2019, pp. 1-5.
"Office Action of Europe Counterpart Application" dated Oct. 22, 2021, p.1-p.3.

* cited by examiner

COATING FILM, MANUFACTURING METHOD THEREFOR, AND PVD APPARATUS

CROSS-REFERENCE TO RELATED APPLICATION

This application is a 371 application of the International PCT application serial no. PCT/JP2016/087612, filed on Dec. 16, 2016, which claims the priority benefit of Japan application no. 2016-058421, filed on Mar. 23, 2016, and Japan application no. 2015-247841 filed on Dec. 18, 2015. The entirety of each of the abovementioned patent applications is hereby incorporated by reference herein and made a part of this specification.

BACKGROUND OF THE INVENTION

1. Field of the Invention

The present invention relates to a coating film, a manufacturing method for the same, and a Physical Vapor Deposition (PVD) apparatus, in particular, to a suitable coating film serving as coating films of various sliding members, a manufacturing method for the same, and a PVD apparatus used in the manufacturing method.

2. Description of Related Art

In recent years, in various industrial fields, especially in the field of automobile, the study of forming hard carbon films serving as coating films to surfaces of members requiring slidability such as engine substrates or other mechanical substrates is prevalent.

The hard carbon film is generally called with various names such as Diamond Like Carbon (DLC) film, amorphous carbon film, i-carbon film, diamond-like carbon film, which is not structurally crystalline and is classified as amorphous.

Moreover, regarding the hard carbon film, it is generally considered that single bonds as seen in diamond crystals and double bonds as seen in graphite crystals are coexisted, in addition to having high hardness, high wear resistance, excellent chemical stability and other characteristics like the diamond crystals, also has low hardness, high lubricity, excellent object adaptability and other characteristics like the graphite crystals. In addition, as it is amorphous, it has excellent flatness and also has low friction when in direct contact with an object material, that is, small friction coefficient or excellent object adaptability.

The characteristics vary significantly depending on a film-forming condition, a sliding condition, and an object material, and a technology that improves those characteristics by controlling the composition, structure, surface roughness of the hard carbon film has been put forward.

On the other hand, chipping resistance (defect resistance) and wear resistance which are important characteristics for the coating film coated on the sliding member are in a trade-off relation, and thus it is difficult to balance these characteristics.

Therefore, the balance of chipping resistance and wear resistance of the coating film of the sliding member is sought by specifying a hard carbon film upon low hardness, or specifying a coexisted existence state of low hardness hard carbon and high-hardness hard carbon, or effectively utilizing low-hardness hard carbon, thereby improving the trade-off relation.

However, the present situation is still insufficient to have the chipping resistance and the wear resistance both ways. Also, for the coating film of the sliding member, in addition to the chipping resistance or the wear resistance, low-friction properties or peeling resistance is further required, but the present situation is that improvement of these characteristics is still insufficient.

For example, Patent Document 1 shows that, by alternately stacking a low-hardness hard carbon layer and a high-hardness hard carbon layer, chipping resistance and wear resistance are balanced, but the balance is still insufficient, and low friction properties or the peeling resistance is insufficient, the low-hardness hard carbon layer is an amorphous structure that uses carbon as a main component, and contains a graphite cluster formed by a mean diameter of above 2 nm, while the high-hardness hard carbon layer contains a graphite cluster formed by a mean diameter of below 1 nm.

Besides, Patent Document 2 discloses a hard carbon film formed using a plasma Chemical Vapor Deposition (CVD) method that uses carbon and hydrogen as main components and has a surface roughness of R max below 0.5 µm, which is an amorphous structure in X-ray diffraction crystallography. As a mixture of clusters of a diamond structure and a graphite structure, chipping resistance and wear resistance are balanced by specifying the numbers of carbon atoms of each cluster; however, to prevent abnormal growth from reducing surface roughness, two clusters of a diamond structure and a graphite structure are required, the number of atoms of each cluster is substantially 100-2000, and thus, even if it is an amorphous structure in the X-ray diffraction, it sometimes also contains crystalline substances if tiny areas are analyzed with electron beam diffraction, the cluster is big in size and is limited in the balance of chipping resistance and wear resistance, and low friction properties or peeling resistance is insufficient.

Besides, Patent Document 3 discloses a metal member formed by at least configuring a DLC film on an iron-containing metal substrate, and the DLC film, in Raman spectroscopy, has a peak derived from graphite which is observed in a range of a wave number of 1550-1600 cm$^{-1}$. There are multiple different intensities of the peak mixed in a film surface, a difference between the maximum and minimum peak intensities is more than one digit, and it is shown that, by locally making a high-hardness DLC film and an excellent-lubricity DLC film separately within the same film surface, a film that combines DLC films with different hardness is made in the same surface, to balance chipping resistance and wear resistance, but the sizes of the excellent-hardness DLC film and excellent-lubricity DLC film in the surface are up to dozens of microns (µm), and thus poor performance caused by parts is easy to occur, and it is difficult to balance chipping resistance and wear resistance uniformly in a sliding surface.

In addition, Patent Document 4 discloses a hard carbon film having a structure that at least one part of sp$^2$ bonding crystals is successively connected in a film thickness direction; however, in order to make the hard carbon film with such a structure contain crystalline substances, the energy of carbon ions reaching the substrate has to be increased, and the bias voltage during film-forming is reduced to −400 to −1000 V. However, under such a film-forming condition, the film formed has low hardness and poor wear resistance. Therefore, even if it is suitable to serve as a conductive member, it cannot be used as a coating film of a sliding member requiring excellent wear resistance.

In addition, Patent Document 5 discloses a nitrogen-containing alignment DLC film in which the amount of carbon having an $sp^2$ hybridized orbital is above 70 atom % and a graphite (002) surface is aligned along a thickness direction, but during film-forming, nitrogen is used in plasma CVD, and the bias voltage is very low to be below −1500 V. Therefore, carbon atoms having an $sp^2$ hybridized orbital is above 70% and the $sp^2/sp^3$ ratio becomes very great to be 2.3-∞, only a hard carbon film with low hardness and poor wear resistance can be obtained, but it still cannot be used as a coating film of the sliding member.

Then, Patent Document 6 proposes a DLC film for piston ring which has a thickness of at least 10 μm and contains a ta-c type DLC not containing hydrogen with an $sp^3$ ratio of at least 40 atom %, and by doping B, O, Si, the $sp^3$ ratio in the outer side 1-3 μm of the ta-c type DLC film is reduced, which has excellent friction during leveling, improves heat resistance under inadequate lubrication environments, and has an effect of inhibiting remains, but still does not sufficiently balance chipping resistance and wear resistance.

PRIOR ART DOCUMENT

Patent Document

Patent Document 1: Japanese Patent Publication Gazette No. 2001-261318
Patent Document 2: Japanese Patent Publication Gazette No. H10-87396
Patent Document 3: Japanese Patent Publication Gazette No. 2009-184859
Patent Document 4: Japanese Patent Publication Gazette No. 2002-327271
Patent Document 5: Japanese Patent Publication Gazette No. 2011-148686
Patent Document 6: Japanese Patent Publication Gazette No. 2013-528697

SUMMARY OF THE INVENTION

Problem to be Solved in the Invention

Conventionally, a method for forming a hard carbon film by CVD is known, but the technologies using CVD are insufficient in balancing chipping resistance and wear resistance, and are also insufficient in improving low friction properties or peeling resistance.

That is, in the film-forming method using CVD, the film-forming temperature is high, and hydrogen-containing gas material is used, therefore the formed hard carbon film contains hydrogen. Such a hard carbon film has low hardness and excellent chipping resistance, and has excellent durability because thick film can be easily formed, and wear resistance is insufficient due to low hardness. Besides, because the formed hard carbon film contains hydrogen, low friction properties in oil are poorer than hard carbon films formed by PVD.

Therefore, inventors of the present invention consider forming a hard carbon film using PVD instead of the abovementioned CVD. PVD uses solid carbon as a raw material in a cathode, and has merits that a hydrogen content in the hard carbon film can be set to below 10 atom %, and hard carbon which has high hardness not containing hydrogen or impurity metal and excellent low friction properties in oil can be formed to a film.

When PVD is used to form a hard carbon film serving as a coating film of the sliding member, it is difficult to generate $sp^3$ bonding carbon (diamond structure) if the substrate temperature is high, and a hard carbon film rich in $sp^2$ bonding carbon (graphite structure), that is, a low-hardness hard carbon film is formed, therefore, the substrate temperature is controlled below 200° C. to form the film and a hard carbon film with high ratio of $sp^3$ bonding carbon and excellent wear resistance is formed.

However, when forming a hard carbon film using PVD in the way mentioned above, if thick hard carbon film is to be formed to ensure sufficient durability and prolong service life, compressive residual stress in the hard carbon film becomes excessively great and the film destructs itself when the film thickness is above 1 μm. Even if the film is not self-destructed, in a state in which the compressive residual stress is great and strain is stored, chipping resistance is low. As a result, in PVD, it is difficult to form a thick hard carbon film in a stabilized way, and it is difficult to ensure sufficient durability.

Therefore, the purpose of the present invention is to provide a technology, which, in addition to being capable of forming thick hard carbon films of excellent durability even using PVD, is able to balance chipping resistance and wear resistance in the formed hard carbon film and able to improve low friction properties and peeling resistance.

Technical Means of Solving the Problem

The inventor carries out various experiments and researches to solve the problem, and, instead of being limited to the conventional idea of controlling the substrate temperature below 200° C. in the PVD, increase the substrate temperature in the PVD film-forming to form a hard carbon film. As a result, when the hard carbon film is formed at a temperature of a substrate temperature of above 200° C., a thick hard carbon film above 1 μm can also be formed even if PVD is used.

However, the hard carbon film formed at such a high temperature has a relatively high ratio of $sp^2$ structure to $sp^3$ structure (also referred to as $sp^2/sp^3$ ratio hereinafter) and low hardness, so that although chipping resistance is excellent, wear resistance is insufficient.

Therefore, the inventor goes on carrying out various researches and considers alternately stacking a hard carbon layer which is formed at a low temperature below 200° C. and the $sp^2/sp^3$ ratio is low and a hard carbon layer which is formed at a high temperature above 200° C. and the $sp^2/sp^3$ is relatively high; experiments are carried out with such a film-forming method, and as a result, a hard carbon film serving as a coating film of a sliding member, which not only has sufficient film thickness but also balances chipping resistance and wear resistance, is successfully formed. Furthermore, when this film-forming method is used, a result surprising the inventor is obtained, that is, a hard carbon film with a completely different structure is formed, and not only the chipping resistance and wear resistance are improved, low friction properties and peeling resistance are also improved.

Specifically, by observing a bright-field Transmission Electron Microscope (TEM) image of a cross-section of the hard carbon film obtained by said film-forming method, under a condition usually used in the bright-field TEM, that is, an acceleration voltage of 200-300 kV, a result is obtained that hard carbon layers are formed in which black hard carbon layers and white hard carbon layers are alternately laminated, and the white hard carbon layers grow on the black hard carbon layers in a fan shape in a thickness direction of the film.

Moreover, by measuring sliding characteristics of the hard carbon film, a result is obtained that not only is the balance of chipping resistance and wear resistance originally in the trade-off relation improved more than before, but low friction properties or peeling resistance is also sufficiently improved. That is, the hard carbon film obtained by the above film-forming method has characteristics of being extremely suitable as a coating film coated on the surface of a member requiring slidability. Furthermore, as mentioned above, by repeating film formation at a temperature above 200° C. during the film forming, thick film can be formed and durability can be improved even if PVD is used.

Generally, it is considered that the reasons for achieving such an effect are as follows.

That is, it is displayed in the bright-field TEM image that the relatively-white hard carbon layers are of low density, and the $sp^2/sp^3$ ratio is high. On the other hand, it is displayed that the relatively-black hard carbon layers are of high density, and the $sp^2/sp^3$ ratio is low. Moreover, as mentioned above, the white hard carbon layers having a great $sp^2/sp^3$ ratio have an insufficient wear resistance but an excellent chipping resistance, and the black hard carbon layers having a small $sp^2/sp^3$ ratio has excellent wear resistance.

Besides, in the present invention, the white hard carbon layers with excellent chipping resistance and the black hard carbon layers with excellent wear resistance are alternately laminated. For this reason, the hard carbon film in which the white hard carbon layers and the black hard carbon layers are alternately laminated becomes a coating film with excellent characteristics of both sides, and can sufficiently improve the balance of chipping resistance and wear resistance.

Moreover, by being a structure in which the white hard carbon layers having a great $sp^2/sp^3$ ratio grow in the black hard carbon layers having a small $sp^2/sp^3$ ratio in a fan shape in the thickness direction, a shape is formed in which hard carbons with different $sp^2/sp^3$ ratio are coexisted at the same position in the thickness direction, the coexistence layer can very efficiently absorb and disperse the stress applied externally, and the chipping resistance can be further improved.

Besides, when observing the bright-field TEM image carefully, the white hard carbon layers grow to a complicated degree which can be described as mesh-like, scale-like, branch-like or layer-like, and the black hard carbon having a small $sp^2/sp^3$ ratio are dispersed in the white hard carbon having a great $sp^2/sp^3$ ratio. In this way, the white hard carbon layers having a great $sp^2/sp^3$ ratio also contain the black hard carbon with a $sp^2/sp^3$ ratio, therefore wear resistance is also improved in the white hard carbon layers.

Moreover, as mentioned above, the white hard carbon layers having a great $sp^2/sp^3$ ratio is soft and the graphite properties are high, so that impact resistance is better than the black hard carbon layers and low friction properties are excellent.

Besides, as mentioned above, the white hard carbon layers having a great $sp^2/sp^3$ ratio grow in a fan shape in the thickness direction, therefore film boundaries of the black hard carbon layers having a small $sp^2/sp^3$ ratio and the white hard carbon layers having a great $sp^2/sp^3$ ratio is not a flat surface parallel to the substrate surface and tilt with an angle. For this reason, it is difficult to strip even when shear stress peeling the film boundaries is applied. As a result, the coating film of the present invention can exhibit excellent peeling resistance.

As mentioned above, when the hard carbon film obtained by the above film-forming method is coated on the surface of a member requiring slidability, compared with the situation in which the existing hard carbon film is coated, chipping resistance and wear resistance can be balanced, and low friction properties and peeling resistance can be improved. Besides, durability can also be improved since thick film can be obtained.

The invention recited in technical solution 1, based on the understanding, is a coating film,
coated on a substrate surface, wherein
when observing a cross-section through the bright-field TEM image, white hard carbon layers shown as relatively white and black hard carbon layers shown as black are alternately laminated in a thickness direction to have a total film thickness ranging from 1 µm to 50 µm, and
the white hard carbon layers have regions that have grown in a fan shape in the thickness direction.

According to the technical solution of the invention, a coating film can be provided which, in addition to balancing chipping resistance and wear resistance, is able to improve low friction properties or peeling resistance and improve durability by thicker film because the white hard carbon layers with excellent chipping resistance and the black hard carbon layers with excellent wear resistance are alternately laminated.

The specific film thickness in the technical solution of the invention ranges from 1 µm to 50 µm in the form of total film thickness. When the total film thickness is excessively thin as below 1 µm, as mentioned above, durability cannot be sufficiently ensured. On the other hand, when the total film thickness is excessively thick as above 50 µm, the film-forming time becomes long and it is industrially unrealistic. The thickness is more preferably ranging from 1 µm to 30 µm.

In addition, the layer number of the black hard carbon layers and the white hard carbon layers is not limited in particular and is suitably set based on the total film thickness of the coating film, the thickness of each hard carbon layer and so on; however, it is preferable to alternately laminate more than two layers respectively to ensure sufficient durability. For example, a coating film, which has a total film thickness of about 5 µm and in which respectively nine layers of the black hard carbon layers and the white hard carbon layers are stacked, can be set as a preferred example.

Besides, as mentioned above, the substrate temperature is set to above 200° C. when forming the white hard carbon layers, and in order to form suitable white hard carbon layers, the substrate temperature is preferably above 210° C., and more preferably above 220° C.

On the other hand, the substrate temperature is set to below 200° C. when forming the black hard carbon layers, and in order to form suitable black hard carbon layers, the substrate temperature is preferably below 180° C.

The invention recited in technical solution 2 is the coating film according to technical solution 1, wherein when observing the cross-section through the bright-field TEM image, an adhesion layer including relatively-white hard carbon is further included between the white hard carbon layer shown as relatively white and the black hard carbon layer shown as black.

The invention recited in the technical solution is preferable because the adhesion between the white hard carbon layers and the black hard carbon layers are improved by forming adhesion layers including white hard carbon.

The invention recited in technical solution 3 is the coating film according to technical solution 1 or technical solution 2, wherein the $sp^2/sp^3$ ratio of the adhesion layer including white hard carbon is 0.4-0.9.

The invention of the technical solution is preferable because when the $sp^2/sp^3$ ratio of the adhesion layer including white hard carbon is 0.4-0.9, excellent performance of the adhesion layer is exhibited.

The invention recited in technical solution 4 is the coating film according to any one of technical solution 1 to technical solution 3, wherein the $sp^2/sp^3$ ratio of the black hard carbon layers is 0.1-0.4.

In the technical solution of the invention, the $sp^2/sp^3$ ratio of the black hard carbon layers is preferably 0.1-0.4. That is, in the black hard carbon layers, when the $sp^2/sp^3$ ratio is below 0.1, the $sp^2/sp^3$ ratio is too low and chipping resistance is extremely low, while when the $sp^2/sp^3$ ratio is above 0.4, the $sp^2/sp^3$ ratio is too high, and wear resistance cannot be ensured.

Besides, in recent years, there is a tendency that low-viscosity oil such as 0W16 or oil with Mo-DTC (Molybdenum Dithio-Carbamate) added is applied to sliding device such as engine oil of a vehicle. In such oil, if the hard carbon layers are rich in $sp^3$, specifically, if the $sp^2/sp^3$ ratio is not below 0.4, sufficient wear resistance cannot be ensured; however, in the technical solution of the invention, the $sp^2/sp^3$ ratio of the black hard carbon layer is below 0.4, therefore the usage can be sufficiently ensured even in the form of oil.

The invention recited in technical solution 5 is the coating film according to any one of technical solution 1 to technical solution 4, wherein the $sp^2/sp^3$ ratio of the white hard carbon layers is 0.4-0.9.

In the technical solution of the invention, the $sp^2/sp^3$ ratio of the white hard carbon layers is preferably 0.4-0.9. That is, in the white hard carbon layers, when the $sp^2/sp^3$ ratio is below 0.4, the $sp^2/sp^3$ ratio is too low and chipping resistance cannot be ensured, and when the $sp^2/sp^3$ ratio is above 0.9, the $sp^2/sp^3$ ratio is too high and wear resistance is extremely low.

Moreover, regarding the relation of the $sp^2/sp^3$ ratio in each layer, it is more preferable that the $sp^2/sp^3$ ratio of the black hard carbon layers is 0.1-0.4, and the $sp^2/sp^3$ ratio of the white hard carbon layers is 0.4-0.9. By alternately laminating these hard carbon layers, by alternately laminating the relatively high-hardness black hard carbon layers having a small $sp^2/sp^3$ ratio and excellent wear resistance and the low-hardness white hard carbon layers having a great $sp^2/sp^3$ ratio and excellent chipping resistance, an excellent coating film can be provided which has excellent chipping resistance and wear resistance and an excellent balance of the two performances.

The invention recited in technical solution 6 is the coating film according to any one of technical solution 1 to technical solution 5, wherein when electron beam diffraction is performed to the white hard carbon layers, diffraction spots are shown at position with a lattice spacing of 0.3-0.4 nm.

In the technical solution of the invention, when electron beam diffraction is performed to the white hard carbon layers, diffraction spots are shown at positions with a lattice spacing of 0.3-0.4 nm, that is, alignment is performed in a way that the C surface, (002) surface of graphite or grapheme which becomes the slip surface is laminated in the thickness direction, so that the sliding surface corresponds to the slip surface of the graphite, low friction properties are improved.

The invention recited in technical solution 7 is the coating film according to any one of technical solution 1 to technical solution 6, wherein the thickness of each layer of the white hard carbon layers is 20-2000 nm, and the thickness of each layer of the black hard carbon layers is 20-1000 nm.

In the technical solution of the invention, a coating film with further ensured chipping resistance and wear resistance can be provided. That is, when the thickness of each layer of the white hard carbon layers is too thin and is below 20 nm, it is difficult to ensure chipping resistance, while when the thickness of each layer is too thick and is above 2000 nm, wear resistance decreases. On the other hand, when the thickness of each layer of the black hard carbon layers is too thin and is below 20 nm, it is difficult to ensure wear resistance, while when the thickness of each layer is too thick and is above 1000 nm, chipping resistance decreases.

In this way, in the technical solution of the invention, in order to ensure both the chipping resistance and the wear resistance in each hard carbon layer, the thickness of each layer of the white hard carbon layers is set to 20-2000 nm, and the thickness of each layer of the black hard carbon layers is set to 20-1000 nm. Accordingly, a coating film with sufficiently balanced chipping resistance and wear resistance is provided.

The invention recited in technical solution 8 is the coating film according to any one of technical solution 1 to technical solution 7, wherein a ratio of the thickness of the white hard carbon layer to the thickness of the black hard carbon layer changes in the thickness direction of the coating film, and increases from the substrate side toward the surface side.

In the technical solution of the invention, a coating film with further balanced chipping resistance and wear resistance can be provided. That is, as mentioned above, the black hard carbon layers have low $sp^2/sp^3$ ratio and excellent wear resistance; on the other hand, the white hard carbon layers have high $sp^2/sp^3$ ratio and excellent chipping resistance. In the technical solution of the invention, a ratio of the thickness of the white hard carbon layers to the thickness of the black hard carbon layers, that is, "the thickness of the white hard carbon layers/the thickness of the black hard carbon layers" increases from the substrate side toward the surface side, so that on the upper surface side of the coating film, the white hard carbon layers become thick and chipping resistance is high, even when large stress is applied to the coating film, chipping resistance is still exhibited. On the other hand, on the lower substrate side of the coating film, the black hard carbon layers become thick and wear resistance is high, even when the upper surface side wears locally and disappears, sufficient wear resistance is still exhibited.

The invention recited in technical solution 9 is the coating film according to any one of technical solution 1 to technical solution 8, wherein when observing the cross-section through the bright-field TEM image, the white hard carbon layers have organized darkness and lightness.

In the technical solution of the invention, having darkness and lightness in the bright-field TEM image means that the white hard carbon layers are not formed by white hard carbon only, and there is a shape where the black hard carbon is dispersed in the white hard carbon layers. As mentioned above, the white hard carbon has excellent chipping resistance and low friction properties, and the black hard carbon has excellent wear resistance. By dispersing the black hard carbon among the gaps of such white hard carbon, the white hard carbon layers can be provided for which excellent chipping resistance, low friction properties and peeling resistance are maintained, and wear resistance is improved.

Moreover, the white hard carbon layers having darkness and lightness in the bright-field TEM image have three-dimensional growth shape which can be described as mesh-like, scale-like, branch-like or layer-like, so that this characteristic also contributes to the improvement of chipping resistance and peeling resistance.

The invention recited in technical solution 10 is the coating film according to any one of technical solution 1 to technical solution 9, wherein
the hydrogen content of the black and/or white hard carbon layers is below 10 atom %.

In the technical solution of the invention, a coating film can be provided which sufficiently exhibits friction-reducing effect in oil and has excellent wear resistance. That is, compared with a hard carbon film not containing hydrogen, the friction-reducing effect in oil of the hard carbon film with a high hydrogen content is poorer, and the hardness also decreases easily. Specifically, when the hydrogen content is above 10 atom %, wear resistance decreases greatly. On the other hand, when the hydrogen content is below 10 atom %, the whole coating film has high hardness and wear resistance can be improved. A content of below 5 atom % is particularly preferable. In the technical solution of the invention, the hydrogen content of at least any one of the black hard carbon layers and the white hard carbon layers is set to below 10 atom %, therefore sufficient wear resistance can be ensured.

Moreover, although it influences little to contain nitrogen (N), boron (B), silicon (Si) and other metal elements, it is preferable that inevitable impurity is eliminated and is not contained in the coating film.

The invention recited in technical solution 11 is the coating film according to any one of technical solution 1 to technical solution 10, wherein
at least one layer of the white hard carbon layer exists in a region within a depth of 1 μm from the surface, and the $sp^2/sp^3$ ratio of the white hard carbon layer is above 0.5.

In the technical solution of the invention, a coating film having more excellent chipping resistance can be provided. That is, the white hard carbon layers exist in the region within a depth of 1 μm from the surface, thereby improving the impact absorbing ability which absorbs impact externally. However, if the $sp^2/sp^3$ ratio of the white hard carbon layers is below 0.5, the impact absorbing ability can only be improved slightly. In the technical solution of the invention, at least one layer of the white hard carbon layer is made to exist in the region within a depth of 1 μm from the surface, and the $sp^2/sp^3$ ratio is set to above 0.5, so that the impact absorbing ability can be improved, and chipping resistance of the coating film can be improved.

The invention recited in technical solution 12 is the coating film according to any one of technical solution 1 to technical solution 11, wherein
an outermost surface is the white hard carbon layer.

In the technical solution of the invention, the soft white hard carbon layer is having a great $sp^2/sp^3$ ratio in the outermost surface, therefore a coating film can be provided which functions as an impact absorbing layer when mechanical impact is applied externally, and which has excellent chipping resistance in particular.

The invention recited in technical solution 13 is the coating film according to any one of technical solution 1 to technical solution 12, wherein
a nano indentation hardness of the black hard carbon layers is 30-80 GPa.

From the perspective of further improving wear resistance of the hard carbon film, the nano indentation hardness of the black hard carbon layers is preferably 30-80 GPa.

The invention recited in technical solution 14 is the coating film according to technical solution 13, wherein
the nano indentation hardness of the white hard carbon layers is 10-30 GPa.

In the technical solution of the invention, the nano indentation hardness of the black hard carbon layers is 30-80 GPa, and the nano indentation hardness of the white hard carbon layers is 10-30 GPa. By making each hard carbon layer have suitable hardness in this way, insufficiency of wear resistance of the hard carbon film is inhibited, while chipping resistance can be effectively improved.

The invention recited in technical solution 15 is a coating film manufacturing method, which
forms the coating film according to any one of technical solution 1 to technical solution 14 on a substrate surface using a PVD method; wherein
conditions for film formation on the substrate the substrate repeatedly alternates temperature increase and temperature decrease between a low temperature range of greater than 50° C. to 200° C. and a high temperature range of greater than 200° C. to 300° C.; and
the substrate is rotate and/or made to revolve.

In the technical solution of the invention, conditions for film formation on the substrate are controlled using PVD so that the substrate temperature repeatedly alternates temperature increase and temperature decrease. Accordingly, a coating film can be formed in which the white hard carbon layers and the black hard carbon layers are alternately laminated in the thickness direction.

Specifically, by raising the temperature to a high temperature range of greater than 200° C. to 300° C. and perform film formation, white hard carbon is generated from active carbon particles, and white hard carbon layers can be formed taking the white hard carbon as growth starting points.

Moreover, the substrate is rotated or made to revolve, thereby black hard carbon can be formed in the mesh gaps of the white hard carbon when the white hard carbon layers having a great $sp^2/sp^3$ ratio is made to grow in a mesh shape, so that the white hard carbon layers grown in a CVD method can also be formed even using PVD. In addition, regarding the rotation and revolution of the substrate, it may be either rotation or revolution only, but it is preferable to carry out rotation and revolution simultaneously.

Then, after the white hard carbon layers are formed, the temperature is decreased to a low temperature range greater than 50° C. to 200° C. to perform film formation, thereby laminating the black hard carbon layers having a small $sp^2/sp^3$ ratio as done in the existing PVD method. Then, a coating film in which the white hard carbon layers and the black hard carbon layers are alternately laminated in the thickness direction can be formed by repeatedly alternating temperature increase and temperature decrease to form the film.

Moreover, it is difficult to form hard carbon layers at a substrate temperature lower than 50° C., and wear resistance of the hard carbon layers decreases easily when the temperature is greater than 300° C. Therefore, the substrate temperature is preferably greater than 50° C. to 300° C., more preferably greater than 75° C. to 300° C., and further preferably 100-300° C. Besides, the film-forming temperature ought to be greater than 200° C. when forming film with the white hard carbon.

The invention recited in technical solution 16 is the coating film manufacturing method according to technical solution 15, wherein the rotation speed of the substrate is controlled to 10-200 rpm, and/or the revolution speed of the substrate is controlled to 1-20 rpm.

The rotation speed of the substrate is preferably controlled to 10-200 rpm, and/or the revolution speed of the substrate is controlled to 1-20 rpm. Accordingly, the black hard carbon can be more suitably formed in the mesh gaps of the white hard carbon.

The invention recited in technical solution 17 is the coating film manufacturing method according to technical solution 15 or technical solution 16, wherein arc PVD is used as the PVD method, and at least one parameter of bias voltage, arc current, heater temperature and furnace pressure is controlled in order to repeatedly alternates temperature increase and temperature decrease of the substrate.

By using arc PVD as the PVD method, active carbon particles with particularly high ionization rate can be generated and coated, and the white hard carbon layers can be easily grown in a fan shape in the thickness direction.

Besides, when arc PVD is used, parameters such as bias voltage, arc current, heater temperature, furnace pressure are optimized when the temperature increase and temperature decrease of the substrate is repeatedly alternated. Accordingly, the temperature increase and temperature decrease of the substrate can be accurately controlled.

The invention recited in technical solution 18 is the coating film manufacturing method according to technical solution 17, wherein
the bias voltage is controlled to −50 to −1500 V, and the arc current is controlled to 10-200 A.

In the coating film manufacturing method, the particularly important parameters are the bias voltage and the arc current. That is, if the bias voltage is above −50 V, it is difficult to form the white hard carbon layers, and if the bias voltage is below −1500 V, it is difficult to form the black hard carbon layers. Moreover, if the arc current is below 10 A, it is difficult to discharge, and when the arc current is above 200 A, wear resistance decreases easily.

The invention recited in technical solution 19 is the coating film manufacturing method according to technical solution 17, wherein
the substrate temperature is decreased by setting the bias voltage to 0 V and/or setting the arc current to 0 A.

In the coating film manufacturing method, by setting the bias voltage to 0 V and/or setting the arc current to 0 A, that is, making the arc current stop flowing, the substrate temperature can be easily decreased.

The invention recited in technical solution 20 is the coating film manufacturing method according to technical solution 19, wherein in a temperature increase initial step after the temperature decrease, the bias voltage is set to −400 V to −1500 V and the arc current is set to 10-200 A to carry out a bombard treatment using graphite target, and a purification treatment of the substrate surface exposed to furnace atmosphere during the temperature decrease and/or film-formation of adhesion layers including white hard carbon are carried out.

In the coating film manufacturing method, in the temperature increase initial step after the temperature decrease, the bias voltage is set to −400 V to −1500 V and the arc current is set to 10-200 A. Then, if film formation is carried out with a graphite target under this condition, because the bias voltage is set to a value greater than the value on a minus side, great impact energy is applied to carbon particles, a mixing mode of etching and film formation on the substrate surface is easily achieved, and the purification treatment of the substrate surface and the formation of the adhesion layer including white hard carbon are simultaneously carried out.

During the temperature decrease in a film-formation step, the substrate surface during the film formation experiences pollution inside the furnace caused by atmosphere gas, furnace temperature and other environments (oxidization or gas adsorption and so on) or stabilization (conversion of $sp^3$ to $sp^2$ and so on), and activity of the substrate surface tends to decrease. For this reason, boundary adhesion force between a coating film before restarting of film formation and a coating film formed after the restarting of film formation tends to decrease easily, and the adhesion force of a part corresponding to the boundary between a white hard layer and a black hard layer tends to decrease easily.

However, in the technical solution of the invention, the boundary of the black hard layer and the white hard layer is formed continuously, and the white hard layer grows from the black hard layer in a fan shape in the thickness direction, therefore excellent adhesion force is obtained, and the adhesion force between the white hard layer and a black hard layer above the white hard layer forms the adhesion layer, therefore the adhesion force in any boundary is excellent.

The invention recited in technical solution 21 is an arc PVD apparatus, which is used in any one of the coating film manufacturing method according to technical solution 17 to technical solution 20, and includes a control mechanism which controls the substrate temperature to greater than 50° C. to 300° C.

In the technical solution of the invention, the PVD apparatus includes a control mechanism which controls the substrate temperature to greater than 50° C. to 300° C., therefore the repeated alternation of temperature increase and temperature decrease of the substrate between the low temperature range of greater than 50° C. to 200° C. and the high temperature range of greater than 200° C. to 300° C. can be easily controlled. The specific control mechanism may be a method of arranging a heater for heating the substrate evenly, a method of introducing a heating mechanism or a cooling mechanism to a fixture that sets the substrate, or a method of automatically controlling the bias voltage or the arc current based on the substrate temperature monitored by a thermocouple.

Besides, in the technical solution of the invention, the black hard carbon layers are easily formed at a temperature of greater than 50° C. to 200° C., and the white hard carbon layers are easily formed at a temperature of greater than 200° C. to 300° C., and more preferably at a temperature of 220° C. to 275° C. Besides, theses temperatures are influenced by the arc current and the bias voltage, and are temperatures changing with each condition.

The invention recited in technical solution 22 is the arc PVD apparatus according to technical solution 21, including:

a substrate supporting mechanism that supports the substrate to rotate and revolve freely; and a rotary control mechanism, which controls the rotation speed and/or revolution speed of the substrate.

In the technical solution of the invention, by supporting the substrate to rotate and revolve freely for controlling the rotation and revolution, black hard carbon can be formed in the mesh gaps of white hard carbon when the white hard carbon layers having a great $sp^2/sp^3$ ratio are grown in a mesh shaped.

The invention recited in technical solution 23 is the arc PVD apparatus according to technical solution 21 or technical solution 22, wherein a cylindrical structure for cooling the substrate is included in a central part of the arc PVD apparatus.

By arranging a cylindrical structure in a central part of the arc PVD apparatus to cool the substrate, even if readily available water is used as a cooling medium, the cooling ability does not become too high. For this reason, the substrate can be easily heated to a target temperature, and the white hard carbon layers are easily formed, while sufficient cooling ability during the cooling can be ensured. Besides, by disposing such a cylindrical structure for cooling, even when a great arc current is used, the film-formation temperature can be prevented from increasing above the target temperature, can film-formation speed can be raised. Besides, because the cooling time can also be shortened, the coating film can be formed with a high productivity even when the film is thickly formed.

Besides, the coating film of the present invention preferably has the following aspects from the perspective of application to a piston ring in particular.

(1) The coating film of the present invention is coated on a substrate surface, when a cross-section is observed using bright-field TEM images, white hard carbon layers shown as relatively white and black hard carbon layers shown as relatively black are alternately laminated in the thickness direction, and a bulging part across interlayers of at least two of the laminated layers appears.

According to the present invention, the relatively white hard carbon layers have a low density and a high $sp^2/sp^3$ ratio, wear resistance being insufficient but chipping resistance being excellent, while the relatively black hard carbon layers have a high density and a low $sp^2/sp^3$ ratio, wear resistance being excellent; therefore, the coating film in which these layers are alternately laminated can sufficiently improve the balance between chipping resistance and wear resistance. Moreover, a bulging part across interlayers of at least two of the laminated layers appears, and the laminating states are not the same and become a disordered shape, so that the black hard carbon layers having excellent wear resistance and the white hard carbon layers having excellent chipping resistance irregularly appear in the lamination direction. As a result, the coating film can have excellent durability that chipping resistance, wear resistance, and peeling resistance are balanced.

In the coating film of the present invention, the bulging part appears within a scope of an area ratio ranging from 5% to 40% when observing the cross-section of the coating film. According to the present invention, the bulging part appears in the cross-section within the above scope, so that the coating film can have excellent durability that chipping resistance, wear resistance, and peeling resistance are balanced.

In the coating film of the present invention, the area ratio of the bulging part in the upper half of the coating film in the lamination direction is greater than the area ratio in the lower half. According to the present invention, the area ratio of the bulging part in the upper half is greater, so that peeling resistance on the surface side of the coating film can be excellent.

In the coating film of the present invention, the bulging part preferably expands toward the lamination direction of the coating film. According to the present invention, because the bulging part expands toward the lamination direction of the coating film, the disorder on the surface side of the coating film increases. As a result, peeling resistance on the surface side derived from the disorder can be more excellent.

In the coating film of the present invention, the white hard carbon layers have regions that have grown in a fan shape toward the lamination direction.

In the coating film of the present invention, the white hard carbon layers have three-dimensional growth morphology which can be described as mesh-like, scale-like, branch-like or layer-like. According to the present invention, the white hard carbon layers have complicatedly grown to a degree which can be described as mesh-like, scale-like, branch-like or layer-like, so that the white hard carbon layers contain black hard carbon. As a result, wear resistance in the white hard carbon layers is also improved, and since the white hard carbon layers are soft and have high graphite properties, impact resistance is better than the black hard carbon layers and low friction properties are excellent.

In the coating film of the present invention, the $sp^2/sp^3$ ratio of the white hard carbon layers is preferably 0.4-0.9, and the $sp^2/sp^3$ ratio of the black hard carbon layers is preferably 0.1-0.4. According to the present invention, because the $sp^2/sp^3$ ratio is within the above range, the white hard carbon layers can have a low density and excellent chipping resistance, and the black hard carbon layers can have a high density and excellent wear resistance.

(2) A piston ring of the present invention has the coating film of the present invention on at least a peripheral sliding surface. According to the present invention, a piston ring can be provided which has excellent durability that peeling resistance and wear resistance are balanced.

Effect of the Invention

According to the present invention, a technology can be provided, which, in addition to being capable of forming thick hard carbon films of excellent durability even using PVD, is able to balance chipping resistance and wear resistance in the formed hard carbon film and able to improve low friction properties and peeling resistance.

Besides, according to the present invention, a coating film, which has excellent durability that chipping resistance, wear resistance and peeling resistance are balanced, and a piston ring can be provided.

BRIEF DESCRIPTION OF THE DRAWINGS

FIG. 3A and FIG. 3 B are diagrams that schematically indicates main parts of a furnace for use in hard carbon film formation of an arc PVD apparatus according to an implementation form of the present invention, FIG. 3A is a situation in which a structure for cooling (cooling tower) is not disposed in the center.

DESCRIPTION OF THE EMBODIMENTS

The present invention is described below according to implementation forms and with reference to the drawings.

First Implementation Form

1. Substrate

In the present invention, the substrate to form a hard carbon film which becomes a coating film is not particularly limited, and in addition to iron-based substrates, non-iron-based metal or ceramic, hard composite and other substrates can be used. Specifically, carbon steel, alloy steel, quenched steel, high-speed tool steel, cast iron, aluminum alloy, Mg alloy or super-hard alloy etc. can be listed, and if the film-forming temperature of the hard carbon film is considered, a substrate whose characteristics are not significantly degraded at a temperature over 200° C. is preferred.

2. Intermediate Layer

When the hard carbon film is formed, an intermediate layer is preferably pre-set on the substrate. Thus, adhesion between the substrate and the hard carbon film can be increased, and in the case that the hard carbon film is worn, the exposed intermediate layer can be given play to the function of wear resistance.

At least one of Cr, Ti, Si, W, B and other elements can be employed for such an intermediate layer. In addition, nitride, carbon nitride, carbide and the like of at least one of Cr, Ti, Si, Al, etc. can be used in a lower layer of the elements, and such compounds include, for example, CrN, TiN, CrAlN, TiC, TiCN, TiAlSiN and the like.

3. Coating Film

The coating film of the present invention has two types of hard carbon layers which are shown as relatively black and white when observed in a cross-sectional bright-field TEM image, and the white hard carbon layers and the black hard carbon layers are alternately laminated to form a hard carbon film.

Figure 1:
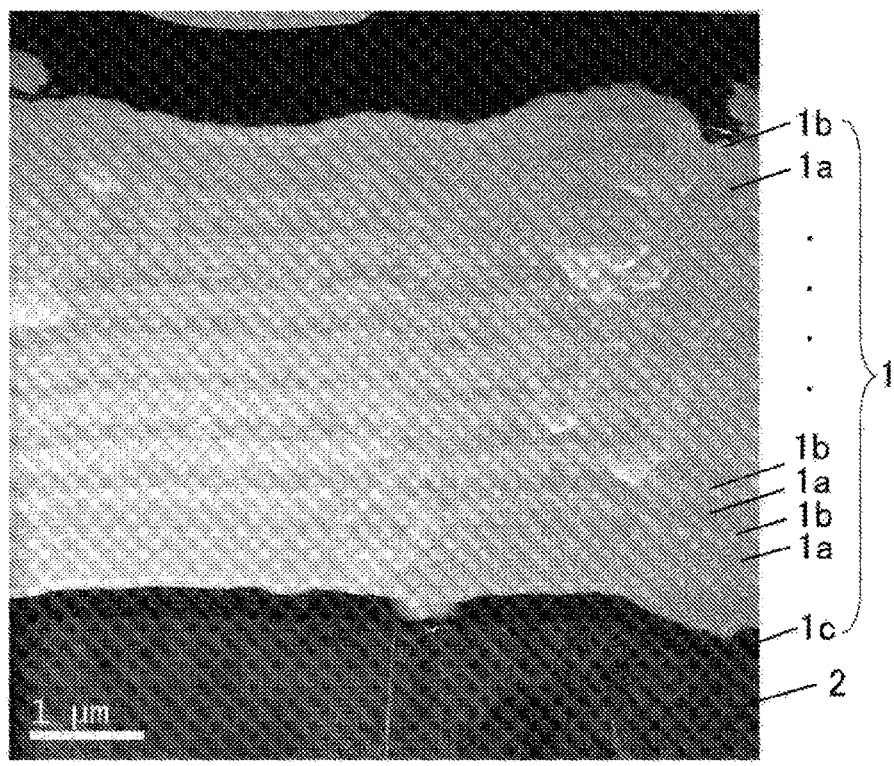
FIG. 1 is a cross-sectional bright-field TEM image of a coating film (hard carbon film) according to an implementation form of the present invention.
Figure 2:
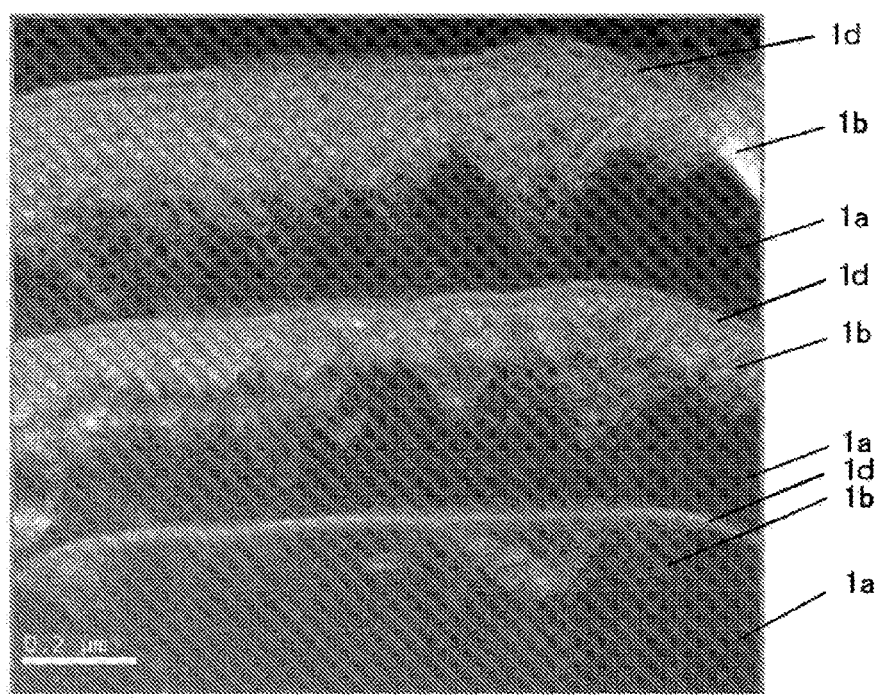
FIG. 2 is an enlarged view of one part of FIG. 1.

FIG. 1 is a cross-sectional bright-field TEM image of a coating film (hard carbon film) according to an implementation form of the present invention. FIG. 2 is an enlarged view of one part of FIG. 1. In addition, FIG. 1 and FIG. 2 are bright-field TEM images obtained under the condition of an acceleration voltage of 300 kV.

In FIG. 1, 1 is a coating film, and 2 is a substrate. As shown in FIG. 1, in this implementation form, the coating film 1 has alternately laminated nine black hard carbon layers 1a and nine white hard carbon layers 1b toward the surface of the coating film 1. In addition, in FIG. 1, an intermediate layer 1c of Cr is arranged right above the substrate 2.

Besides, it is obtained from FIG. 2 that black hard carbon is dispersed in the gaps of the grown white hard carbon layers since a white hard carbon layer 1b has grown in a fan shape in the thickness direction and have organized darkness and lightness. Besides, it is obtained that a white hard carbon layer 1b has a growth shape with a characteristic which can be described as mesh-like, branch-like, or scale-like, and in the thickness direction in the hard carbon film, there is a region with a structure in which the white hard carbon layer 1b and the black hard carbon layer 1a are coexisted.

Moreover, bright-field TEM images as shown in FIG. 1, FIG. 2 are obtained, the thickness of the black hard carbon layer 1a having a small $sp^2/sp^3$ ratio and the thickness of the white hard carbon layer 1b having a great $sp^2/sp^3$ ratio are measured, and calculation is performed on how the two ratios change in the thickness direction of the coating film, by which the ratio change in the thickness of the two layers, that is, the black hard carbon layer 1a having a small $sp^2/sp^3$ ratio and the white hard carbon layer 1b having a great $sp^2/sp^3$ ratio, in the thickness direction of the coating film can be measured.

In the present invention, regarding the white hard carbon layer having a great $sp^2/sp^3$ ratio, the $sp^2/sp^3$ ratio is preferably 0.4-0.9, and more preferably 0.4-0.8. Besides, the white hard carbon layer preferably has a diffuse scattering pattern (amorphous scattering pattern) in an electron beam diffraction, and may locally indicate diffraction spots (scattering pattern of graphite) at a position with a lattice spacing of 0.3-0.4 nm. In this way, most of the white hard carbon is amorphous, accordingly, crystal orientation disappears in the white hard carbon layer 1b, and the chipping resistance at the time when stress repeatedly acts on the hard carbon film which is a coating film or when positive and negative stress acts on the hard carbon film is improved.

Besides, in the case when the electron beam diffraction is performed on the white hard carbon layers, and diffraction spots are shown at a position with a lattice spacing of 0.3-0.4 nm, that is, scattering pattern of graphite is shown, graphite of excellent lubricity is contained in the layers, and low friction properties are improved.

On the other hand, the $sp^2/sp^3$ ratio of the black hard carbon layers, is preferably 0.1-0.4, and more preferably 0.2-0.35. Besides, the hydrogen content of the black hard carbon layer is preferably below 10 atom %, more preferably below 5 atom %, and further preferably 0 atom %, and it is preferable if the remaining part substantially contains carbon only since hardness is increased and wear resistance is improved. In addition, the expression of "substantially contains carbon only" here means not containing impurity except N, B, Si and other inevitable impurity.

It is also preferable that the hydrogen content of the white hard carbon layer 1b is below 10 atom %, and more preferably below 5 atom %, and the remaining part substantially contains carbon only, not containing impurity except N, B, Si and other inevitable impurity; however, even if these elements are contained in the white hard carbon layer 1b, chipping resistance can also be improved.

Moreover, the nano indentation hardness of the black hard carbon layer is preferably 30-80 GPa, by which wear resistance of the hard carbon film can be further improved. On the other hand, the nano indentation hardness of the white hard carbon layer is preferably 10-30 GPa. By making each hard carbon layer have suitable hardness in this way, insufficiency of wear resistance of the hard carbon film can be inhibited, and chipping resistance can be effectively improved.

4. Manufacturing Method of the Coating Film (Hard Carbon Film) and the Arc PVD Apparatus (1) Manufacturing Method When the coating film 1 is formed, an arc PVD method, a sputtering PVD method and the like may be used, and particularly the arc PVD method is preferred.

In the arc PVD method, high-temperature molten particles fly out of a target with a certain probability. The particles are also referred to as droplets, and have high activity at high temperatures. Therefore, in the case that carbon is used as a target, the high hard carbon particles flying out at high temperature in a high-activity state take, as shown in FIG. 2, the high-activity white particles as a starting point to grow in a fan shape, the white hard carbon layers which have grown in a fan shape in the thickness direction are easily formed.

In this implementation form, in the case that the hard carbon film is formed using the arc PVD, a bias voltage or arc current is regulated, or the substrate is heated by a heater, or the substrate is cooled in a forced way by importing a cooling mechanism on a fixture (holder) provided with the substrate to control the substrate temperature and control the furnace pressure and the like, thereby forming a hard carbon film in which hard carbon layers with different $sp^2/sp^3$ ratios are alternately laminated.

Besides, when forming the black hard carbon layer with a $sp^2/sp^3$ ratio of 0.1-0.4, it is formed in an existing way at a substrate temperature ranging from 50° C. to 200° C. Therefore, in order to alternately laminate the black hard carbon layer and the white hard carbon layer, the following method can be used which imports a cooling step after the formation of white hard carbon layer to decrease the substrate temperature, and forms the black hard carbon layer when the substrate temperature is below 200° C.

On the other hand, when forming the white hard carbon layer with a $sp^2/sp^3$ ratio of 0.4-0.9, it is controlled so that the substrate temperature ranges from 200° C. to 300° C., more preferably 220° C. to 275° C. In addition, such control of substrate temperature is preferably carried out by controlling the bias voltage to −50 to −400 V; however, the substrate temperature can also be controlled by methods such as change of the arc current, heating by a heater or cooling by a holder, applying a bias voltage intermittently such as discontinuously or pulse-like to change the voltage value, therefore the method is not particularly limited to bias voltage control only.

In contrast with such an implementation form, in the existing hard carbon film manufacturing method, particularly in the case that arc PVD is used for film formation, in order to form a high-density hard carbon film, usually only the bias voltage or the arc current is controlled to form the film under the condition that the substrate temperature is above 200° C. and does not increase, but the furnace temperature is not uniform due to thermal capacity of a workpiece, a mounting fixture or charge amount, and the substrate temperature cannot be sufficiently controlled.

Besides, as the existing hard carbon film manufacturing method, the following technology is also proposed: setting the bias voltage to −500 to −1000 V, coating an inner layer (lower layer) with a hard carbon layer which is seen as white in a bright-field TEM image, then forming a hard carbon layer which is seen as darker than the inner layer in a bright-field TEM image thereupon at a bias voltage of −100 V. However, in this method, only the bias voltage is controlled to grade the density of the hard carbon film in the thickness direction, therefore the hard carbon layer as in the present invention which has a fan-shaped growth structure is not formed by alternately laminating the hard carbon layers having a great $sp^2/sp^3$ ratio and the hard carbon layers having a small $sp^2/sp^3$ ratio, and the coating film, which sufficiently balances chipping resistance and wear resistance and has sufficiently excellent low friction properties and peeling resistance, is not provided.

In this way, in the existing hard carbon film manufacturing method, a concept of strictly controlling the substrate temperature is lacking, and there is no understanding about the following effect from the existing hard carbon film manufacturing method: as in the present invention, the structure of the hard carbon layer can be controlled by controlling the substrate temperature, chipping resistance and wear resistance can be balanced by alternately laminating hard carbon layers with different $sp^2/sp^3$ ratios, and low friction properties and peeling resistance can also be improved simultaneously by controlling the structure growth shape of the hard carbon layer having a great $sp^2/sp^3$ ratio.

In addition, during film-forming, the substrate is made to rotate and revolve, and preferably, the substrate rotates at 10-200 rpm, and revolves at 1-20 rpm.

Under such a manufacturing condition, although the reason for forming the white hard carbon layer having a great $sp^2/sp^3$ ratio and the hard carbon layer growing in a fan shape is uncertain, the reason may be considered as follows.

That is, in the case that the substrate temperature exceeds 200° C. but does not exceed 300° C., the temperature is high, and thus the hard carbon layer is easy to grow as a low-density hard carbon layer. However, if the substrate is made to rotate and revolve at a speed mentioned above for example, although the substrate temperature is maintained at a temperature ranging from 200° C. to 300° C., kinetic energy of the carbon ions flying out of the target varies greatly due to whether the carbon ions impact the substrate from the front or obliquely.

That is, the carbon ions incident into the substrate from the front, due to great impact energy, become a high temperature when impacting the substrate and are easy to become hard carbon which is white-colored and has low density or a great $sp^2/sp^3$ ratio; on the other hand, the carbon ions incident into the substrate obliquely, due to small impact energy, become a lower temperature when impacting the substrate than the situation of being incident from the front, and form a film as hard carbon which is black-colored and has high density or a small $sp^2/sp^3$ ratio.

As a result, for the hard carbon layer formed while rotating or revolving the substrate at a temperature ranging from 200° C. to 300° C., the white hard carbon layer and the black hard carbon are also coexisted even in the same film-forming thickness position.

Also, it is considered that if the upper layer is further coated, as the substrate temperature becomes a high temperature ranging from 200° C. to 300° C., when the incident carbon ion is from the front, the white hard carbon having a great $sp^2/sp^3$ ratio grows on a previously formed film in a growth shape having characteristics as can be described as mesh-like, branch-like, or scale-like.

As a result, the structure of the following white hard carbon layer having a great $sp^2/sp^3$ ratio may be formed: the low-density and sparse hard carbons which are seen as white in the bright-field TEM image are in a mesh shape, and the high-density and dense hard carbons which are seen as black are dispersed in the gaps.

Then, if the substrate temperature is over 225° C., the white hard carbon layer is easy to be locally graphitized, and sometimes crystallization is carried out locally in the hard carbon layer. If such crystallization is carried out, hard carbons are obtained for which weak diffraction spots (scattering patterns of graphite) are present in an electron beam diffraction at a position with a lattice spacing of 0.3-0.4 nm. The position is considered to correspond with the c surface, that is the (002) surface of graphite or graphene having a $sp^2$ structure, and for the white hard carbon layer having such diffraction spots, the c surface of graphite is aligned in a direction parallel to the substrate, so that low friction properties in particular can be improved.

In addition, hereinabove, the substrate temperature is preferably ranging from 200° C. to 300° C. when forming the white hard carbon layer having a great $sp^2/sp^3$ ratio, and the reason is as follows: in the case of below 200° C., even if the carbon ions are incident into the substrate from the front, the $sp^2/sp^3$ ratio becomes low and it is difficult for the white hard carbon layer to grow; on the other hand, in the case of above 300° C., even if the carbon ions are incident obliquely into the substrate due to a rotating fixture, black hard carbon is hardly formed and white hard carbon layer having a great $sp^2/sp^3$ ratio where the black hard carbon is dispersed in the gaps is hard to form.

Also, as mentioned above, in addition to adjusting the bias voltage, the substrate temperature can be adjusted by adjusting the arc current, the heater temperature, the furnace pressure and the like, and thus the bias voltage is not particularly limited; however, if the following situation is considered: it is difficult to form a mesh-shaped hard carbon layer if the bias voltage is over −50 V, on the other hand, it is difficult to form a mesh-shaped hard carbon layer in the case of below −400 V, the bias voltage is preferably −50 to −400 V, and more preferably −100 to 300 V. Besides, regarding the furnace pressure, in the case of a vacuum environment set as $10^{-4}$ Pa to $5 \times 10^{-1}$ Pa, compared with the situation where hydrogen or nitrogen is imported, a low-friction and high-wear-resistance hard carbon film can be obtained, which is thus preferred.

Referring to FIG. 2, it is preferable that in the temperature increase initial step after the temperature decrease, the bias voltage is set to −400 V to −1500 V and the arc current is set to 10-200 A to carry out a bombard treatment using graphite target, and a purification treatment of the substrate surface exposed to furnace atmosphere during the temperature decrease and/or film-formation of the adhesion layer 1d including white hard carbon are carried out. The reason is that: if the bias voltage is greater than −400 V, it is difficult to carry out the purification treatment of the substrate surface, if the arc current is below 10 A, the purification treatment is hard to be effective, and if the arc current is above 200 A, the film-forming mode is stronger than the purification treatment, influence of droplet increases and surface roughness decreases, and thus it is preferably below 200 A. The $sp^2/sp^3$ ratio of the adhesion layer 1d including white hard carbon is preferably 0.4-0.9. The reason is that if the $sp^2/sp^3$ ratio is in this range, excellent performance as an adhesion layer can be exhibited.

The hard carbon film in this implementation form can be manufactured using an arc PVD apparatus, and a specific film-forming device, for example, may be an arc PVD apparatus M720 manufactured by the Japanese ITF Company. In the following, manufacturing of a hard carbon film (coating film) using the arc PVD apparatus is specifically described.

At first, a metal raw material (surface roughness Ra: 0.2 µm) becoming a substrate is prepared, and the substrate is set in an arc PVD apparatus provided with a rotating and revolving fixture.

Next, the arc current and the bias voltage are adjusted, in a way that the substrate temperature is above 50° C. but below 200° C. while the substrate is made to rotate and revolve, to form a black hard carbon layer having a small $sp^2/sp^3$ ratio. Then, control in a way that the substrate temperature is above 200° C. but below 300° C., and in a way of heating the substrate by a heater or adjusting the bias voltage or the arc current to make the substrate temperature increase continuously, and make the white hard carbon layer having a great $sp^2/sp^3$ ratio grow in a fan shape. Then, a film-forming time of becoming non-bias and/or non-arc-current is imported to cool the substrate, and when the substrate temperature decreases to a predetermined temperature, form a black hard carbon layer again; by repeating the film-formation step of the black hard carbon layer in this way, the hard carbon film in which the black hard carbon layers and the white hard carbon layers are alternately laminated can be formed.

As mentioned above, it is considered that, by changing the substrate temperature continuously in this way from a low-temperature environment to a high-temperature environment, the highly active hard carbon particles which can fly into the substrate with certain probability and have a great $sp^2/sp^3$ ratio become the starting points, the growth of the hard carbon layer is influenced by the lower layer, and the white hard carbon layer having a great $sp^2/sp^3$ ratio grows out of the black hard carbon layer having a small $sp^2/sp^3$ ratio in a fan shape in the thickness direction as in a CVD growth.

It is considered that, at this point, the film is formed while rotating the substrate in the high temperature film-forming environment, the white hard carbon and the black hard carbon are easy to coexist in either of the thickness direction and the rotating direction, and the white hard carbon is easy to be coated in a fan shape in the thickness direction.

(2) Arc PVD Apparatus

Figure 3A:
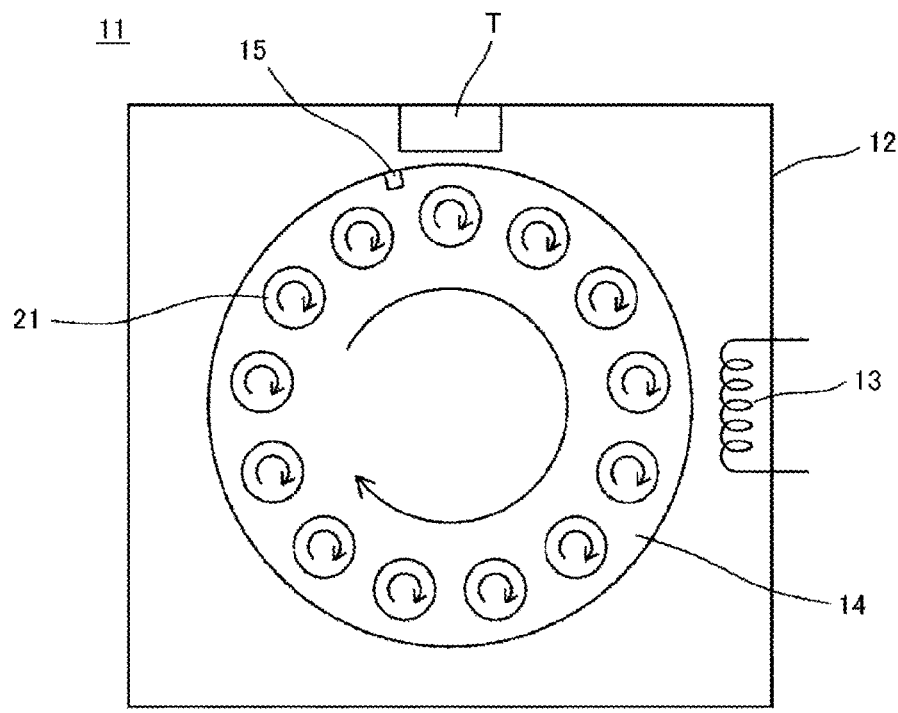
Figure 3B:
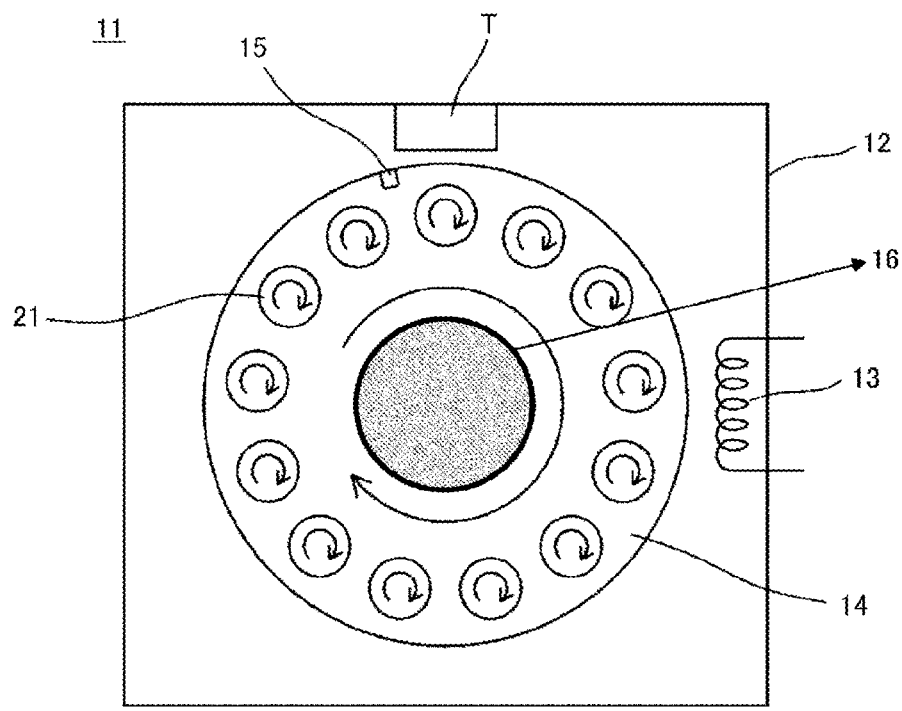
FIG. 3B is a situation in which the structure is disposed.

Then, the arc PVD apparatus of the implementation form is specifically described. FIG. 3A and FIG. 3B are diagrams that schematically indicates main parts of a furnace for use in formation of hard carbon film of the arc PVD apparatus according to the implementation form, FIG. 3A is a situation in which a structure for cooling (cooling tower) is not disposed in the center, and FIG. 3B is a situation in which the structure is disposed.

As shown in FIG. 3A, the arc PVD apparatus includes a furnace 11 for use in film-forming and a control device (not shown). In the furnace 11, a vacuum chamber 12, a plasma generation device (not shown), a heater 13, a rotating and revolving fixture 14 serving as a substrate supporting device, a thermocouple (T.C.10 mm square bar) 15 serving as a temperature measuring device, a bias power source (not shown) and a pressure adjusting device (not shown) that adjusts the pressure in the furnace are arranged.

Besides, preferably, a cooling and heating device that supplies cooling water and/or warm water or steam is provided on the substrate supporting device. In addition, T is a target (carbon target), and 21 is a substrate (iron substrate) with an intermediate layer formed thereon. Besides, actually there are five targets T, but for the sake of simplification, only one target is depicted in FIG. 3A.

The plasma generation device includes an arc power source, a cathode and an anode, by discharge through a vacuum arc between the cathode and the anode, carbon is evaporated from the carbon target T as a cathode material, and plasma containing an ionized cathode material (carbon ion) is generated. The bias power source applies a predetermined bias voltage to the substrate 21 to make the carbon ions fly towards the substrate 21 with suitable kinetic energy.

The rotating and revolving fixture 14 is disk-like, and freely rotates in the arrow direction with the center of the disk as a rotation center; on the upper surface, multiple rotary shafts concentrically perpendicular to the center of the disk are provided at an equal interval. Multiple substrates 21 are retained by the rotary shafts respectively, and freely rotate in the arrow direction. Thus, the substrate 21 is retained on the rotating and revolving fixture 14 to rotate and revolve freely. Besides, for the rotating and revolving fixture 14, a metal material with high thermal conductivity such as stainless steel is used in a manner of quickly transferring heat between the substrates 21 and the rotating and revolving fixture 14 and making temperatures of the substrates 21 and the rotating and revolving fixture 14 substantially equal.

Heater 13 and the cooling device heat and cool the rotating and revolving fixture 14 respectively, thus indirectly heating and cooling the substrates 21. Here, the heater 13 is formed in a manner of regulating the temperature. On the other hand, the cooling device is formed in a manner of adjusting a supply speed of cooling water. Specifically, the cooling device is formed in a manner of supplying the cooling water for the rotating and revolving fixture 14 and/or the rotary shaft during implementation of cooling and stopping supplying the cooling water when the cooling stops, and is formed in a manner of supplying warm water or steam for the rotating and revolving fixture 14 and/or the rotary shaft during heating and stopping supplying the warm water or steam when the heating stops.

Besides, the thermocouple 15 is installed near the substrate 21, and is formed in a manner of indirectly measuring the substrate temperature to make at least one of the arc current value, the bias voltage value, and the heater temperature change in film-forming, thus controlling the substrate temperature to be a target substrate temperature.

Regarding the rotary speed of the rotating and revolving fixture 14, the control device controls various rotary speeds to be a predetermined rotary speed under a preselected combination of rotation and revolution in a manner of forming a fan-shaped hard carbon layer having a great $sp^2/sp^3$ ratio and forming a film without bias; in addition, according to the measurement results of the thermocouple 15 for the temperature of the substrate 21, the bias voltage, the arc current, the heater temperature, and the furnace pressure are optimized. Thus, the temperature of the substrate 21 during film-forming can be maintained within a temperature range of above 50° C. but below 300° C. Besides, the work of the cooling device and the applied pattern of the bias voltage are controlled as required.

For example, a feedback system is preferably added when the substrate is disposed in 3 segments, and the feedback system measures substrate temperature in upper, middle and lower segments, properly changes arc current values in various positions of the upper, middle and lower segments during film-forming according to measured values, and set the substrate temperatures in various positions of the upper, middle and lower segments as a target temperature. Thus, stabilization of a film structure of hard carbon films formed on the substrate disposed on the upper, middle and lower segments can be achieved.

In addition, in the film-forming of the existing hard carbon film, for film-forming parameters such as bias voltage, arc current and the like, in most cases, predetermined values are input into the control device before film-forming, film-forming is conducted under a pre-programmed film-forming condition, and the arc current or the heater temperature is not changed according to the substrate temperature measured in the middle of film-forming based. Therefore, in the existing hard carbon film formation, temperatures in the furnace or temperatures between batches are more non-uniform.

Preferably, in the central part of the arc PVD apparatus, a cylindrical structure (cooling tower 16) as shown in FIG. 3B for cooling the substrate is arranged. By circulating and using cooling water in such a cylindrical structure, even if readily available water is used as a cooling medium, the cooling ability does not become too high, and the substrate can be easily heated to a target temperature, thus the white hard carbon layers are easily formed, and sufficient cooling ability during the cooling can be ensured, thus it is preferable.

Figure 4:
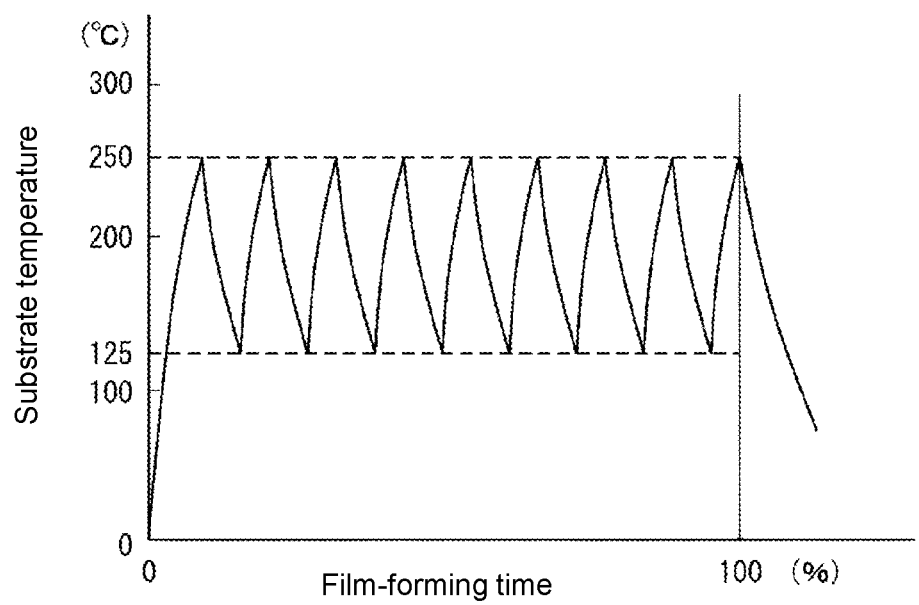
FIG. 4 is a diagram that conceptually indicates changes of the substrate temperature when forming a hard carbon film according to an implementation form of the present invention.

During the formation of the coating film 1 (see FIG. 1), the temperature control device makes the substrate 21 repeatedly alternates temperature increase and temperature decrease between a temperature set within a low temperature range of above 50° C. but below 200° C. and a temperature set within a high temperature range of above 200° C. and below 300° C. An example is shown in FIG. 4. In FIG. 4, the vertical axis is the substrate temperature (° C.), and the horizontal axis is the film thickness position of the hard carbon film, specifically, a ratio (%) of the film-forming time when the time required for formation of the total film thickness is set as 100%. The temperature in the low temperature range, the temperature in the high temperature range, speed and cycle numbers of temperature increase and temperature decrease are suitably set according to the thickness of each layer of the black hard carbon layers and the white hard carbon layers, total film thickness of the hard carbon film and the like.

5. Inspection Method of Hard Carbon Film (Coating Film)

The hard carbon film (coating film) formed in the above is inspected according to the following items.

(1) Observation of TEM Structure

Through a TEM (Transmission Electron Microscope), a coating film thin-filmed using a Focused Ion Beam (FIB) is observed, for example, in a bright-field TEM image at an acceleration voltage of 300 kV.

(2) Measurement of Hydrogen Content

The hydrogen content in the coating film is measured through Hydrogen Forward Scattering (HFS) analysis.

(3) Judgment Method of Crude Density of the Hard Carbon Layer

The density of the hard carbon film may generally be measured using a Grazing Incidence X-ray Analysis (GIXA) method or a Grazing Incidence X-ray Reflectivity (GIXR) method. However, in a situation where small-density crude hard carbon and large-density dense hard carbon in the hard carbon layer are dispersed finely, it is difficult to utilize the method to measure density of various portions with high precision.

For the crude density judgment of such a hard carbon layer, for example, a method of effectively utilizing brightness of a bright-field TEM image disclosed in Japanese Patent Gazette No. 4918656 can be used. Specifically, in the bright-field TEM image, the lower the density is, the more the penetration amount of the electron beam increases. Therefore, in the case of forming the same substance, the lower the density is, the whiter the image is. So, in order to judge the density of each layer in multiple hard carbon layers of the same composition, preferably, a cross-sectional bright-field TEM image of the structure of the hard carbon layer is used.

In the cases of the bright-field TEM images in FIG. 1 and FIG. 2, it can be seen that the color of the hard carbon layers of the section 1b is whiter than the color of the hard carbon of the section 1a. Moreover, it can be obtained that, in the section 1b, it becomes hard carbon in which white hard carbon is a complicated state able to be described as mesh-like, scale-like, branch-like or layer-like extending in the thickness direction, and black hard carbon is disperse in the gaps. In order to make a color difference between white and black evident, color correction can be made in a manner of highlighting the contrast.

(4) Amorphous Judgment Method of the Coating Film

The coating film formed by thin-filming the cross-section using FIB carries out electron beam diffraction under a condition of an acceleration voltage of 200 kV, a sample absorption current $10^{-9}$ A, and a beam spot size of 0.7 nm$\phi$, to obtain an image of a tiny beam diffraction pattern, if the image is a diffuse scattering pattern, it is judged as amorphous, and if a spot-like pattern is observed, intensity spacing L near the spot is measured, and lattice spacing $\lambda$ (nm) is calculated according to a relation that 2L$\lambda$=camera length.

(5) Measuring Method of the ID/IG Ratio Obtained By Raman Spectroscopy

The hard carbon layer may be obtained by separating peaks of Raman spectrum obtained through Raman spectroscopy. Specifically, the peak position of the D band is fixed to 1350 $cm^{-1}$ for selection, the area intensity of this peak is set as ID, the peak position of the G band is near 1560 $cm^{-1}$ for free setting and peak separation, the area intensity of this peak is set as IG, and the ID/IG ratio is calculated.

(6) Measuring method of the $sp^2/sp^3$ Ratio

Through Electron Energy-Loss Spectroscopy (EELS) analysis, 1s→$\pi$* intensity and 1s→$\sigma$* intensity is measured, the 1s→$\pi$* intensity is viewed as the $sp^2$ intensity, the 1s→$\sigma$* intensity is viewed as the $sp^3$ intensity, and the ratio, that is, a ratio of 1s→$\pi$* intensity to 1s→$\sigma$* intensity is calculated as the $sp^2/sp^3$ ratio. Accordingly, the $sp^2/sp^3$ ratio in the present invention is actually the ratio of $\pi/\sigma$ intensity. Specifically, with a spectral imaging method in a STEM (scanning TEM) mode, under a condition of an acceleration voltage of 200 kv, a sample absorption current of $10^{-9}$ A, and a beam spot size of $\phi$ 1 nm, EELS obtained at an interval of 1 nm is accumulated, to extract a C-K absorption spectrum in the form of average information from a region of about 10 nm, and the $sp^2/sp^3$ ratio is calculated.

If the measuring method is used, the $sp^2/sp^3$ ratio in a tiny portion can be measured; as the $sp^2/sp^3$ ratio of the high-density hard carbon is less than that of the low-density hard carbon, the judgment method of crude density of hard carbon can be substituted.

(7) Measuring Method of Nano Indentation Hardness

The nano indentation hardness is measured using a Nanoindenter ENT1100a manufactured by Elionix Company. When the hardness of each layer of the laminated hard carbon layers is measured, after the cross-section of the film is mirror-polished, an indentation load value is decreased to carry out measurement.

6. Effect of the Implementation Form

As stated above, in the hard carbon film (coating film) of the present invention, the hard carbon layer which has a small $sp^2/sp^3$ ratio and is black in the bright-field image of the TEM structure and the hard carbon layer which has a great $sp^2/sp^3$ ratio and is white in the bright-field image of the TEM structure are alternately laminated. Besides, the white hard carbon layer has parts that have grown in a fan shape, if the white hard carbon layer is specifically observed, the white hard carbon layer is a complicated structure which can be described as mesh-like, scale-like, branch-like or layer-like in the thickness direction and has darkness and lightness, and hard carbon which is black in the bright-field image of the TEM structure is dispersed in the gaps of the white part. Such a hard carbon layer structure is a very special structure not seen in the existing hard carbon layer.

Moreover, the white hard carbon having a small $sp^2/sp^3$ ratio is soft and has resistance to impact and excellent low friction properties, thus by forming the white hard carbon to a three-dimensionally extending structure, stress applied externally can be very efficiently dispersed, and low friction properties and chipping resistance are excellent. Besides, the white hard carbon layer grows from the black hard carbon layer in a fan shape, thus the white hard carbon layer is not a structure which is laminated with the black hard carbon layer in a plane, but is a laminated structure which has many surface sections that contacting with the black hard carbon layer. Therefore, even when there are many lamination boundaries, it becomes a structure which is resistant to interlayer peeling.

Moreover, the black hard carbon dispersed in the gaps of the white hard carbon is of high density, and thus can increase wear resistance.

As a result, chipping resistance and wear resistance can be sufficiently balanced, and low friction properties and peeling resistance are improved. As a result, sliding characteristics can be significantly increased compared with the existing hard carbon film, and chipping resistance and peeling resistance can also be significantly increased compared with the existing hard carbon film. Besides, because black and white hard carbon can be repeatedly alternated and laminated to form thick film, durability is also excellent. It is particularly suitable for use in automobile parts such as a piston ring, a piston pin, a gear, a bearing, a valve lifter and common mechanical parts such as a vane and a bearing.

EXAMPLE

Next, the present invention is more specifically described according to an example.

[1] Experiment 1

1. Manufacturing of a Test Sample (1) Forming of a Substrate and an Intermediate Layer A substrate (in line with a material of SWOSC-V) was prepared, to form a piston ring shape with a diameter of 80 mm, a ring radial-direction width (a1) of 2.6 mm, a ring width-direction width (h1) of 1.2 mm, grinding was carried out after a CrN layer having a thickness of 10 μm coated the surface of the sliding plane using an arc PVD apparatus, and a CrN layer coated steel substrate having surface roughness Rz of 0.3 μm was prepared.

(2) Forming of a Coating Film (a) Example 1

In example 1, an arc PVD apparatus provided with the furnace 11 shown in FIG. 3A for film-forming is used to form a hard carbon film with a total film thickness of 4.7 μm on the surface of the substrate 21 by a method similar to the coating film manufacturing method of the above implementation form.

Specifically, after the substrate on which a CrN layer is formed is disposed on the rotating and revolving fixture 14 which is also a substrate supporting device, set the substrate in the furnace 11 of the arc PVD apparatus and coat metal Cr layer with a thickness of 0.2 μm as an intermediate layer, then use a graphite cathode to start forming a hard carbon film.

At this point, the substrate 21 is made to rotate at a speed of 39 rpm and revolve at a speed of 4 rpm. Besides, regarding the temperature condition during film-forming, after arc discharge is carried out at a bias voltage of −700 V and an arc current of 40 A for 10 minutes, arc discharge is carried out at a bias voltage of −170 V and an arc current of 40 A to increase temperature for 2100 seconds while heater heating is carried out from 50° C. to 245° C., and a black hard layer and a white hard layer with a total film thickness of 0.5 μm are formed, then arc discharge is stopped at a bias voltage of 0 V and an arc current of 0 A to cool to 125° C. for 3600 seconds. After that, arc discharge is carried out for 90 seconds at a bias voltage of −1000 V and an arc current of 40 A to form an adhesion layer including white hard carbon, then arc discharge is carried out again at a bias voltage of −170 V and an arc current of 40 A to increase temperature for 2100 seconds while heater heating is carried out from 125° C. to 245° C., and a black hard layer and a white hard layer with a total film thickness of 0.5 μm are formed; the repeating cycle of temperature increase and temperature decrease is carried out 8 times to form a hard carbon film with a total film thickness of 4.7 μm.

(b) Comparative Example 1

In the comparative example 1, the existing PVD method is used and arc discharge is carried out at a bias voltage of −75 V and an arc current of 40 A for 80 minutes to form a hard carbon film with a thickness of 1.0 μm on the surface of the substrate 21.

(c) Comparative Example 2

In the comparative example 2, except that the film-forming time is changed from 80 minutes in the comparative example 1 to 96 minutes, and the film-forming thickness is set to 1.2 μm, a hard carbon film is formed similarly as the comparative example 1.

(d) Comparative Example 3

In the comparative example 3, the existing CVD method is used and a hard carbon film with a thickness of 4.5 μm is formed on the surface of the substrate 21. In addition, the total film-forming time is set to 80 minutes.

2. Evaluation of Coating Film

Observe the structure of the coating films obtained in the example and comparative example 1 to comparative example 3 and measure the film thickness of the coating film to evaluate wear resistance, chipping resistance, low friction properties, and peeling resistance respectively. In addition, except the comparative example 3 which uses methane (hydrocarbon gas) in raw material gas, the hydrogen content in other coating films are all below 10 atom %.

(1) Structure of the Coating Film

Take an image of each formed coating film by a bright-field TEM with an acceleration voltage of 200-300 kv, observe the structure of each coating film and measures the film thickness of each coating film.

Figure 5:
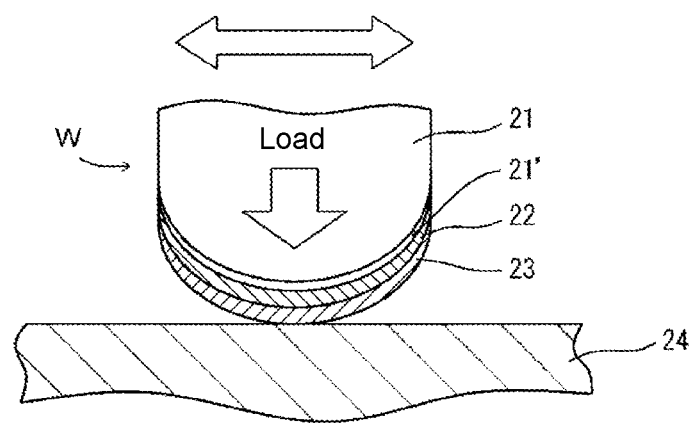
FIG. 5 is a diagram that schematically indicates a friction-wear testing method.

(2) Evaluation of Wear Resistance, Chipping Resistance, Low Friction Properties, Peeling Resistance, and Durability Next, use each formed coating film to conduct a friction-wear testing by a SRV (Schwingungs Reihungund and Verschleiss) experiment machine commonly used in the evaluation of sliding members for automobile. Specifically, as shown in FIG. 5, in the state that the sliding surface of a friction-wear testing sample W contacts with SUJ2 material 24 which is a sliding object, use 5W-30 (Mo-DTC free) for the lubricant oil and apply a load of 100-1000 N (increment of 100 N), slide back and forth for 10 minutes under each load and observe the sliding surface of the friction-wear testing sample W by a microscope. Then, obtain from the observation result the load under which damage is present in each coating film. Besides, calculate the friction coefficient under the load. In addition, in FIG. 5, 21' is CrN, 22 is the intermediate layer, and 23 is the coating film.

Figure 6:
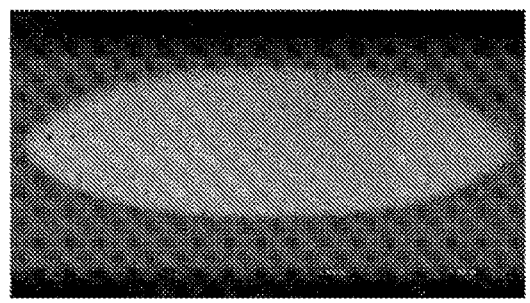
FIG. 6 is a microscope photo that indicates a friction-wear testing result of example 1.
Figure 7:
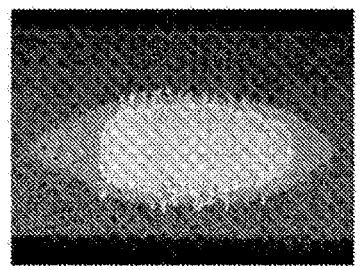
FIG. 7 is a microscope photo that indicates a friction-wear testing result of comparative example 1.

The result of each evaluation is shown in table 1. Besides, the friction-wear testing results of the example 1 and the comparative example 1 are shown in FIG. 6 and FIG. 7 respectively. In addition, in the comparative example 2, during film-forming, the coating film is already self-destructed, thus the evaluation by SRV experiment machine is not conducted.

TABLE 1

|  | Example 1 | Comparative example 1 | Comparative example 2 | Comparative example 3 |
| --- | --- | --- | --- | --- |
| Structure of the coating film | black layers and white layers are alternately laminated, and the outermost surface layer is a white layer | black layer only | black layer only | White layer only |
| Number of laminated layers | Black layer 6 White layer 6 | Black layer 1 | Black layer 1 | White layer 1 |
| Total thickness of the coating film (μm) | 4.7 μm | 1.0 μm | 1.2 μm (self-destructed) | 4.5 μm |
| White hard carbon layers grown in a fan shape in the thickness direction | Existing | None | None | None |
| sp$^2$/sp$^3$ ratio | 0.3 for the black layer, 0.7 for the | 0.2 for the black layer | 0.2 for the black layer | 0.5 for the white layer |

TABLE 1-continued

|  | Example 1 | Comparative example 1 | Comparative example 2 | Comparative example 3 |
|---|---|---|---|---|
| Load under which peeling or chipping is generated | white layer Not generated even under 1000 N and is able to continue | 300 N | — | 200 N |
| Low friction properties (friction coefficient) | 0.06 | 0.08 | — | 0.09 |

According to Table 1, it is confirmed that, in the example 1, a coating film with a film thickness of 4.7 μm and on internal destruction can be formed, and as shown in FIG. 6, normal surface shape is maintained even after 10 minutes of SRV test under a high load of 1000 N; therefore, by alternately laminating the black hard carbon layers and the white hard carbon layers and forming a coating film which has white hard carbon layers grown in a fan shape in the thickness direction, a thick coating film, which has a thickness above 1 μm and good wear resistance, chipping resistance, peeling resistance, durability and low friction properties, can be provided.

In contrast, in the comparative example 1 which sets the film thickness to 1.0 μm, no peeling or chipping occurs under 100N, 200N, and evaluation can be conducted under normal wear, but as shown in FIG. 7, under a load of 300 N, the film is stripped or chipped and the substrate is exposed, the evaluation is ended under this load. According to the test result, it can be confirmed that, in a coating film with black hard carbon layers only, chipping resistance and peeling resistance is not good, and durability is also insufficient.

Besides, in the comparative example 2 which sets the film thickness to 1.2 μm, internal destruction occurs during film-forming and the film is self-destructed, even without setting the film to the SRV experiment machine can it be confirmed that durability (service life) is low. Furthermore, in the comparative example 3 which sets the film thickness to 4.5 μm in the CVD method, no peeling or chipping occurs under 100N, and evaluation can be conducted under normal wear, but under a load of 200 N, the film is stripped or chipped and the substrate is exposed, the evaluation is ended under this load.

Experiment 2

1. Example 2-Example 21

According to the result of the experiment 1, it can be confirmed that when the black hard carbon layers and the white hard carbon layers are laminated to form a coating film, wear resistance, chipping resistance, low friction properties, peeling resistance and durability (service life) is good; therefore, in the experiment 2 below, various film-forming conditions are changed, and the $sp^2/sp^3$ ratio of the black hard carbon layer, the $sp^2/sp^3$ ratio of the white hard carbon layer, the thickness of the black hard carbon layer and the thickness of the white hard carbon layer are made to be different respectively to form coating films of examples 2-21 as shown in Table 2, so that hard carbon layers are formed that in the structure where the black layers and the white layers are alternately laminated as in the example 1, the outermost surface layer is the white layer, and the total film thickness is 4.8-5.8 μm.

TABLE 2

|  | $sp^2/sp^3$ ratio | | Thickness (nm) | | Laminating | Total |
|---|---|---|---|---|---|---|
|  | Black hard carbon layers | White hard carbon layers | Black hard carbon layers | White hard carbon layers | numbers of black and white hard carbon layers | film thickness (μm) |
| Example 2 | 0.07 | 0.7 | 300 | 300 | 8 | 5.0 |
| Example 3 | 0.1 | 0.7 | 300 | 300 | 8 | 5.0 |
| Example 4 | 0.25 | 0.7 | 300 | 300 | 8 | 5.0 |
| Example 5 | 0.4 | 0.7 | 300 | 300 | 8 | 5.0 |
| Example 6 | 0.45 | 0.7 | 300 | 300 | 8 | 5.0 |
| Example 7 | 0.2 | 0.3 | 300 | 300 | 8 | 5.0 |
| Example 8 | 0.2 | 0.4 | 300 | 300 | 8 | 5.0 |
| Example 9 | 0.2 | 0.8 | 300 | 300 | 8 | 5.0 |
| Example 10 | 0.2 | 0.9 | 300 | 300 | 8 | 5.0 |
| Example 11 | 0.2 | 1.0 | 300 | 300 | 8 | 5.0 |
| Example 12 | 0.3 | 0.7 | 5 | 300 | 16 | 5.0 |
| example 13 | 0.3 | 0.7 | 20 | 300 | 16 | 5.1 |
| Example 14 | 0.3 | 0.7 | 1000 | 300 | 4 | 5.4 |
| Example 15 | 0.3 | 0.7 | 1100 | 300 | 4 | 5.8 |
| Example 16 | 0.3 | 0.7 | 300 | 5 | 16 | 5.0 |
| Example 17 | 0.3 | 0.7 | 300 | 20 | 16 | 5.1 |
| Example 18 | 0.3 | 0.7 | 300 | 2000 | 2 | 4.8 |
| Example 19 | 0.3 | 0.7 | 300 | 2500 | 2 | 5.8 |

2. Evaluation

Figure 8:
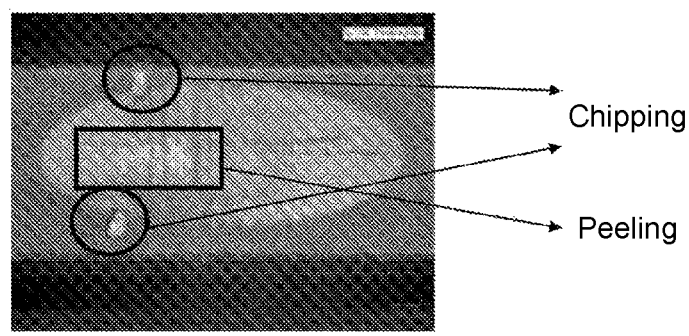
FIG. 8 is a microscope photo that indicates chipping and peeling in the friction-wear testing result.

As for the coating films of example 2-example 19, the method similar to the experiment 1 is used, the films are slid back and forth by the SRV test device under a load of 1000 N for 60 minutes, and the sliding surface of the friction-wear testing sample W is observed by a microscope. Then, chipping resistance and peeling resistance of the coating film are evaluated according to the observation result. Wear resistance is evaluated from wear depth, and low friction properties are evaluated by measuring the friction coefficient value. The evaluation result is shown in Table 3. A photo of a real coating film for which peeling and chipping occur during the SRV test is shown in FIG. 8.

In addition, the evaluation references in each evaluation are as follows.

(1) Wear Resistance

It is evaluated as "excellent" when the total wear amount is within ¼ of the total film thickness, as "good" when over ¼ but below ½, as "qualified" when the base is not exposed and the wear amount is above ½ of the total film thickness, and as "unqualified" when the wear amount is above the total film thickness and the base is exposed.

(2) Chipping Resistance

It is evaluated as "excellent" when there is no chipping, as "good" when there are 1-4 points of tiny chipping, as "qualified" when there is more than 5 tiny chipping, and as "unqualified" when the chipping is above 0.05 mm.

(3) Peeling Resistance

It is evaluated as "excellent" when there is no peeling, as "good" when the total peeling amount is within ⅛ of the total sliding area, as "qualified" when within ¼, and as "unqualified" when the peeling is over ¼.

TABLE 3

| | Wear resistance | Chipping resistance | Low friction properties | Peeling resistance |
|---|---|---|---|---|
| Example 2 | Excellent | Qualified | 0.07 | Good |
| Example 3 | Excellent | Good | 0.07 | Excellent |
| Example 4 | Excellent | Excellent | 0.06 | Excellent |
| Example 5 | Excellent | Excellent | 0.06 | Excellent |
| Example 6 | Qualified | Excellent | 0.06 | Excellent |
| Example 7 | Excellent | Qualified | 0.08 | Good |
| Example 8 | Excellent | Excellent | 0.06 | Excellent |
| Example 9 | Excellent | Excellent | 0.06 | Excellent |
| Example 10 | Good | Excellent | 0.06 | Excellent |
| Example 11 | Qualified | Excellent | 0.06 | Excellent |
| Example 12 | Qualified | Excellent | 0.06 | Excellent |
| Example 13 | Good | Excellent | 0.06 | Excellent |
| Example 14 | Excellent | Good | 0.08 | Excellent |
| Example 15 | Excellent | Qualified | 0.08 | Good |
| Example 16 | Excellent | Qualified | 0.08 | Qualified |
| Example 17 | Excellent | Good | 0.07 | Good |
| Example 18 | Good | Excellent | 0.06 | Excellent |
| Example 19 | Qualified | Excellent | 0.06 | Excellent |

According to Table 3, when comparing the example 2-example 6 in which the $sp^2/sp^3$ ratios of the black hard carbon layer are made to be different respectively, in the example 2 with a $sp^2/sp^3$ ratio of the black hard carbon layer below 0.1, chipping resistance decreases slightly. Besides, in the example 6 with a $sp^2/sp^3$ ratio of the black hard carbon layer above 0.4, wear resistance decreases slightly. Accordingly, it can be confirmed that the $sp^2/sp^3$ ratio of the black hard carbon layer is preferably 0.1-0.4 as in the example 3-example 5.

Besides, when comparing the example 7-example 11 in which the $sp^2/sp^3$ ratios of the white hard carbon layer are made to be different respectively, in the example 7 with a $sp^2/sp^3$ ratio of the white hard carbon layer below 0.4, chipping resistance decreases slightly, and in the example 11 with a $sp^2/sp^3$ ratio above 0.9, wear resistance decreases slightly. Accordingly, it can be confirmed that the $sp^2/sp^3$ ratio of the white hard carbon layer is preferably 0.4-0.9 as in the example 8-example 10.

Next, when comparing the example 12-example 15 in which the thickness of the black hard carbon layer is made to be different respectively, it can be confirmed that as in the example 12, when the thickness of the black hard carbon layer is below 20 nm, wear resistance decreases, and it can be confirmed that when the thickness is above 1000 nm, chipping resistance decreases. Accordingly, it can be confirmed that the thickness of the black hard carbon layer is preferably 20-1000 nm as in the example 13-example 14.

Then, when comparing the example 16-example 19 in which the thickness of the white hard carbon layer is made to be different respectively, it can be confirmed that, when the white hard carbon layer is too thin, chipping resistance decreases, and when the white hard carbon layer is too thick, wear resistance decreases. Then, it can be confirmed that the thickness of the white hard carbon layer is preferably 20-2000 nm as in the example 17-example 18.

[3] Experiment 3

1. Example 20-Example 21

In the experiment 3 below, in order that in the structure where the black layer and the white layer are alternately laminated as in the example 1, the outermost surface layer is the white layer and the total film thickness is 8 μm, the coating films of the examples 20-21 as shown in Table 4 are formed in the following manner: nine black layers and nine white layers are alternately laminated, various film-forming conditions are changed, and a ratio of the thickness of the white hard carbon layer to the thickness of the black hard carbon layer changes in the thickness direction of the coating film.

TABLE 4

| | $sp^2/sp^3$ ratio | | Thickness (nm) | | |
|---|---|---|---|---|---|
| | Black hard carbon layer | White hard carbon layer | Position in the film thickness direction | Black hard carbon layer | White hard carbon layer |
| Example 20 | 0.3 | 0.7 | Film surface side | 300 | 300 |
| | | | Film middle part | 300 | 300 |
| | | | Film base side | 300 | 300 |
| Example 21 | 0.3 | 0.7 | Film surface side | 150 | 450 |
| | | | Film middle part | 300 | 300 |
| | | | Film base side | 550 | 50 |

2. Evaluation

As for the coating films of the example 20-example 21, the method similar to the experiment 2 is used, the evaluation is conducted by the SRV test device under a load of 1000 N for an evaluation time prolonged for 30 minutes in each example, and wear resistance, low friction properties and durability are evaluated based on the average value in 3 tests. The evaluation result is shown in Table 5. In addition, regarding the durability, the duration time when no chipping or peeling occurs in the test piece is set as the evaluation time.

TABLE 5

| | Wear resistance | Low friction properties | Durability |
|---|---|---|---|
| Example 20 | Excellent | 0.06 | 150 minutes |
| Example 21 | Excellent | 0.06 | No chipping and peeling damage in 360 minutes |

According to Table 5, in the example 21 for which the ratio of the thickness of the white hard carbon layer to the thickness of the black hard carbon layer changes in the thickness direction of the coating film and the value increases from the substrate side toward the surface side, compared with the example 20 in which the ratio of the thickness of the white hard carbon layer to the thickness of the black hard carbon layer does not change, durability increases significantly. Accordingly, it can be confirmed that, in the coating film for which the ratio of the thickness of the white hard carbon layer to the thickness of the black hard carbon layer changes in the thickness direction of the coating film and the value increases from the substrate side toward the surface side, excellent durability can be expected.

[4] Experiment 4

1. Example 22-Example 23

In the experiment 4 below, the coating film of the example 22 is formed, wherein the coating film has a film structure similar to the example 21, and is a hard carbon layer film with a total film thickness of 8 μm which contains 15 atom % of hydrogen in the hard carbon by flowing methane gas in a step of form the hard carbon into a film in a manner that hydrogen is contained in the hard carbon.

2. Evaluation

Then, use the method similar to the experiment 3 to evaluate wear resistance, low friction properties and durability with the coating films of the example 22 containing hydrogen and of the example 21 not containing hydrogen by the SRV test device under a load of 1000 N. However, the test is conducted under the condition that Mo-DTC is contained in the lubricant oil. The evaluation result is shown in Table 6.

TABLE 6

| | Wear resistance | Low friction properties | Durability |
| --- | --- | --- | --- |
| Example 21 | Excellent | 0.06 | No chipping and peeling damage in 360 minutes |
| Example 22 | Qualified | 0.06 | 60 minutes |

According to Table 6, in the example 21 in which the hydrogen content of the black hard carbon layer and the white hard carbon layer is below 10 atom %, compared with the example 22 in which the hydrogen content of the black hard carbon layer and the white hard carbon layer is above 10 atom %, durability increases significantly. Accordingly, it can be confirmed that for the coating film in which the hydrogen content in the hard carbon is below 10 atom %, excellent wear resistance and durability can be expected.

Then, the nano indentation hardness of each layer of the hard carbon layers of the example 21 exhibiting excellent sliding performance is evaluated, and the hardness can be confirmed to be the hardness as shown in Table 7.

TABLE 7

| | $sp^2/sp^3$ ratio | | Nano indentation hardness | |
| --- | --- | --- | --- | --- |
| | Black hard carbon layer | White hard carbon layer | Black hard carbon layer | White hard carbon layer |
| Example 21 | 0.3 | 0.7 | Film surface side 35 GPa<br>Film middle part 51 GPa<br>Film base side 67 GPa | 11 GPa<br>18 GPa<br>26 GPa |

[5] Experiment 5

1. Example 24

In the experiment 5 below, a coating film of the example 24 is formed, which is a film of hard carbon layers with a total film thickness of 5.3 μm, and in the film-formation step of the example 21, the adhesion layer containing white hard carbon is not formed.

2. Evaluation

Then, use the method similar to the experiment 3 to evaluate wear resistance, low friction properties and durability with the coating film of the example 24 not containing the adhesion layer by the SRV test device under a load of 1000 N.

TABLE 8

| | Wear resistance | Low friction properties | Durability |
| --- | --- | --- | --- |
| Example 21 | Excellent | 0.06 | No chipping and peeling damage in 360 minutes |
| Example 24 | Good | 0.06 | 90 minutes |

According to Table 8, in the example 24 not containing the adhesion layer, compared with the example 21 containing the adhesion layer, wear resistance and durability decrease. Accordingly, for the coating film containing the adhesion layer, excellent wear resistance and durability can be expected.

[Second Implementation Form]

Next, a technology preferably applied to a piston ring of the coating film of the present invention is described.

In recent years, researches of the hard carbon film serving as a coating film to a peripheral sliding surface of a piston ring is popular. The hard carbon film is generally called with various names such as Diamond Like Carbon (DLC) film, amorphous carbon film, i-carbon film, diamond-like carbon film, and is structurally classified as amorphous.

Regarding the hard carbon film, it is considered that single bonds as seen in diamond crystals and double bonds as seen in graphite crystals are coexisted, in addition to high hardness, high wear resistance, excellent chemical stability and other characteristics like the diamond crystals, there are also low hardness, high lubricity and excellent object adaptability and other characteristics like the graphite crystals. Besides, as it is amorphous, it has excellent flatness and also has low friction properties (that is, small friction coefficient) or excellent object adaptability when in direct contact with an object material.

For the peripheral sliding surface of a piston ring, chipping resistance (defect resistance) and wear resistance are important characteristics, but chipping resistance (defect resistance) and wear resistance are in a trade-off relation, and thus it is difficult to arrange a coating film balancing these characteristics. As a means to solve this problem, the following situation is discussed: arrange a low-hardness hard carbon film or arrange a film in which low-hardness hard carbon and high-hardness hard carbon are coexisted to balance chipping resistance and wear resistance.

However, the present situation is still insufficient to balance chipping resistance and wear resistance. In particular, for the coating film arranged on a piston ring, in addition to chipping resistance and wear resistance, low friction properties or peeling resistance is further required, but the present situation is that improvement of these characteristics is still insufficient.

Regarding the improvement of characteristics of the hard carbon film, a hard carbon film form by the CVD method recited in Patent Document 2-5 or a hard carbon film formed by the PVD method recited in Patent Document 1 and 6 is disclosed. Specifically, in Patent Document 2, as a hard carbon film which has high hardness, low friction coefficient, and excellent sliding characteristics, the following carbon film is disclosed which has a surface roughness of R max below 500 nm, and in which the diamond structure cluster having 100-2000 carbon atoms and the graphite structure cluster having 100-2000 carbon atoms exist in a ratio of 0.3-3.

In Patent Document 4, it is disclosed that a conductive hard carbon film having a structure that at least one part of $sp^2$ bonding crystals is successively connected in a film thickness direction is used as a conductive hard carbon film and a coating member thereof, which have good wear resistance, oxidization resistance and corrosion resistance and are used in a usage or step in which the conductive members contact with each other or in a corrosive environment.

Patent Document 3 discloses a metal member formed by at least configuring a DLC film on an iron-containing metal substrate as a metal member provided with a DLC film capable of localizing a region with excellent hardness and a region with excellent lubricity at the same plane to have both of them, the DLC film, in Raman spectroscopy, has a peak derived from graphite which is observed in a range of a wave number of 1550-1600 [cm$^{-1}$], there are multiple different intensities of the peak mixed in a film surface, and a difference between the maximum and minimum peak intensities is more than one digit.

Patent Document 5 discloses an orientation amorphous carbon film having a new structure and exhibiting high conductivity and a forming method thereof, the orientation amorphous carbon film takes C as a main component, contains 3-20 atom % of N and 0 atom % to 20 atom % of H, when a total content of C is set as 00 atom %, the carbon ($Csp^2$) having a $sp^2$ hybridized orbital is above 70 atom % and below 100 atom %, a graphite (002) surface is oriented along the thickness direction, the film can be formed by a direct-current plasma CVD method which discharge an reaction gas that contains nitrogen gas and more than one compound gas chosen from $Csp^2$-containing carbon cyclic compound gases and nitrogen-containing heterocyclic compound gases which contain $Csp^2$, nitrogen and/or silicon below −1500 V.

Patent Document 1 regarding a PVD film discloses a DLC hard multi-layer film as a coating film which has excellent wear resistance, low friction coefficient, and excellent sliding characteristics and a member having the same excellent characteristics, the film is an amorphous structure taking carbon as a main component, and low-hardness hard carbon layers containing graphite cluster with a mean diameter above 2 nm and high-hardness hard carbon layers containing graphite cluster with a mean diameter below 1 nm are alternately laminated in the film.

It is disclosed in Patent Document 6 that a slide element, in particular a piston ring has a coating which has a metal-containing adhesion layer and a ta-C DLC layer with a thickness of at least 10 μm on at least one sliding surface from the inner side toward the outer side.

The technologies using the above CVD method do not sufficiently balance chipping resistance and wear resistance, and the improvement of low friction properties or peeling resistance is also insufficient. That is, in a film-forming method using CVD, the film-forming temperature is high, and a hydrogen-containing gas raw material is used, thus hydrogen is contained in the formed hard carbon film. The hard carbon film has low hardness and excellent chipping resistance, and has excellent durability because thick film can be easily formed. However, wear resistance is insufficient due to low hardness, besides, hydrogen is contained in the hard carbon film, thus low friction properties in oil is poorer than the hard carbon film formed by PVD.

On the other hand, PVD uses solid carbon as raw material in a cathode, can set the hydrogen content in the hard carbon film to below 10 atom %, and can form the hard carbon film having excellent low friction properties in oil into a film at a high hardness not containing hydrogen or impurity metal. When the hard carbon film is formed by PVD, if the substrate temperature is high, it is difficult to generate $sp^3$ bonding carbon (diamond structure), and a low-hardness hard carbon film rich in $sp^2$ bonding carbon (graphite structure) is formed; for this reason, conventionally, film-forming is conducted at a substrate temperature below 200° C. to form a hard carbon film having a great ratio of $sp^3$ bonding carbon and excellent wear resistance.

However, when the hard carbon film is formed by PVD, if the film is formed to a thickness above 1 μm to ensure sufficient durability, compressive residual stress in the hard carbon film becomes too great and the film is self-destructed. Even if the film is not self-destructed, it is a state with great compressive residual stress and stored strain, thus chipping resistance is low. Accordingly, in PVD, it is difficult to form a thick hard carbon film in a stabilized manner, and it is difficult to ensure sufficient durability.

The purpose of the present invention is to provide a coating film having excellent durability that chipping resistance, wear resistance and peeling resistance are balanced, and a piston ring having the coating film.

The coating film and the piston ring of the present invention are described in detail with reference to the drawings. In addition, the present invention is not limited to the description below and the drawings, variations within the scope of the gist are also included.

[Coating Film]

Figure 9:
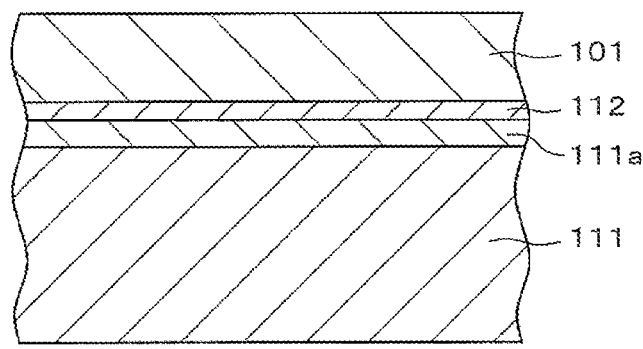
FIG. 9 is a schematic cross-sectional view that indicates an example of a coating film according to the present invention.
Figure 10:
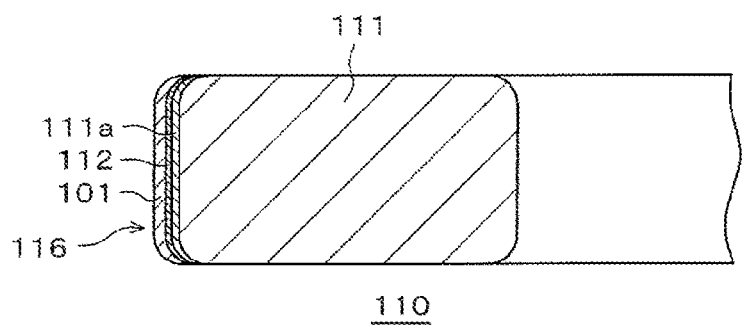
FIG. 10 is a schematic cross-sectional view that indicates an example of a piston ring according to the present invention.

The coating film of the present invention is a coating film 101 coated on a surface of a substrate 111 as shown in FIG. 9-FIG. 12. Moreover, the coating film 101 is characterized in that when a cross-section is observed through a bright-field TEM image, a white hard carbon layer 102 shown as relatively white and a black hard carbon layer 103 shown as relatively black are alternately laminated in a lamination direction Y, and a bulging part 105 crossing interlayer of at least two of the laminated layers is present. Besides, the piston ring of the present invention is characterized in that the coating film 101 is provided on at least a peripheral sliding surface 116 as shown in FIG. 10. The bright-field TEM image can be obtained by using a FIB to observe the thin-filmed coating film 101 through a TEM at an acceleration voltage of 300 kV for example. In addition, the lamination direction Y means the direction in which the coating film 101 is laminated in sequence on the substrate 111.

The coating film 101 where the bulging part 105 is present on the cross-section has the effect that chipping resistance is balanced with wear resistance and peeling resistance and durability is excellent. Regarding the display of such effect, the relatively white hard carbon layer 102 has low density and a great $sp^2/sp^3$ ratio, wear resistance is insufficient but chipping resistance is excellent, and the relatively black hard carbon layer 103 has high density and a small $sp^2/sp^3$ ratio, and wear resistance is excellent; therefore, the coating film 101 in which these layers are alternately laminated can sufficiently improve the balance between chipping resistance and wear resistance. Furthermore, the bulging part 105 crossing interlayer of at least two of the laminated layers is present, the laminating state is not the same and become a disordered shape, thus the black hard carbon layer 103 having excellent wear resistance and the white hard carbon layer 102 having excellent chipping resistance are irregularly present in the lamination direction Y. As a result, chipping resistance, wear resistance, and peeling resistance can be excellent.

In the following, structural elements of the coating film and the piston ring are specifically described.

(Substrate)

The substrate 111 is an object member on which the coating film 101 is arranged. The substrate 111 is not particularly limited, and iron-based metal, non-iron-based metal, ceramic, hard composite and other substrates can be listed. For example, carbon steel, alloy steel, quenched steel, high-speed tool steel, cast iron, aluminum alloy, magnesium alloy, super-hard alloy and the like can be listed. In addition, if the film-forming temperature of the coating film 101 is considered, a substrate whose characteristics are not significantly degraded at a temperature over is preferred 200° C. The substrate 111 may have a base layer 111a shown in FIG. 9 as required. The base layer 111a may be a layer which increases the adhesion with an intermediate layer 112 described below, and is not particularly limited.

As the piston ring substrate 111 in the case of applying the coating film 101 to a piston ring 110, various substrates which can be used as the substrate of the piston ring 110 can be listed, and are not particularly limited. For example, various steel materials, stainless steel material, casting material, steel-casting material and the like can be used. Among these, martensite-based stainless steel, chromium-manganese steel (SUP9 material), chrome-vanadium steel (SUP10 material), silicon-chrome steel (SWOSC-V material) and the like can be listed.

A layer of nitride, carbon nitride, carbide and the like of at least one of Cr, Ti, Si, Al, etc. can be preset on the piston ring substrate 111 as a base layer (111a). Such compound layer may be, for example, CrN, TiN, CrAlN, TiC, TiCN, TiAlSiN and the like. Among these, nitrided layers (not shown) formed by conducting nitriding treatment, or Cr—N based, Cr—B—N based, Ti—N based wear resistance films (not shown) and so on can be preferably listed. Among these, it is preferable to form Cr—N based, Cr—B—N based, Ti—N based wear resistance films. In addition, the piston ring 110 exhibits excellent wear resistance even without arranging such nitriding-treated film or Cr-based or Ti-based wear resistance film, thus it is not necessary to form nitriding-treated film or Cr-based or Ti-based wear resistance film.

Pre-treatment may be performed to the piston ring substrate 111 as required. Preferably, the pre-treatment polishes the surface to adjust surface roughness. The adjustment of surface roughness is preferably conducted by, for example, methods which conduct lapping by diamond grains to the surface of the piston ring substrate 111 to polish the surface. The piston ring substrate 111 can be preferably used in the pre-treatment before the formation of the intermediate layer 112 described below, or in the pre-treatment of the base layer 111a arranged in advance of the formation of the intermediate layer 112.

(Intermediate Layer)

As shown in FIG. 9 and FIG. 10, the intermediate layer 112 is preferably arranged between the substrate 111 and the coating film 101 as required. The adhesion between the substrate 111 and the coating film 101 can be further improved by the intermediate layer 112, and when the coating film 101 is worn, the exposed intermediate layer 112 can exhibit a wear resistance function.

The intermediate layer 112 may be a layer having at least one or more than two of Cr, Ti, Si, W, B and other elements. In addition, on a lower layer of the intermediate layer 112 (between the substrate 111 and the intermediate layer 112), a base layer 111a containing nitride, carbon nitride, carbide and the like which contain at least one or more than two of Cr, Ti, Si, Al and other elements may be arranged. The compound may be, for example, CrN, TiN, CrAlN, TiC, TiCN, TiAlSiN and so on. In addition, the base layer 111a arranged on the intermediate layer 112 as required can be formed by the following method for example: set the substrate 111 in a chamber and vacuumize the chamber, then perform pre-heating or ion cleaning to import inert gas, and use vacuum vapor deposition or ion plating to form the layer.

The intermediate layer 112 in the case that the coating film 101 is used in the piston ring 110 may be a titanium film or a chrome film. In this case, it is also not necessary to arrange the intermediate layer 112, and the formation is optional. The intermediate layer 112 of titanium film or chrome film and the like can be formed by various film-forming methods such as vacuum vapor deposition, sputtering, ion plating and so on, for example, it can be conducted by setting the piston ring substrate 111 in the chamber and vaccumizing the chamber, then performing pre-heating or ion cleaning and the like to import inert gas. The thickness of the intermediate layer 112 is not particularly limited, and is preferably within the range of above 0.05 μm and below 2 μm. In addition, the intermediate layer 112 is preferably formed at least on the peripheral sliding surface 116 where the piston ring 110 contacts with a cylinder liner (not shown) and slides, and can also be formed on other surfaces, for example, the upper surface, lower surface and inner peripheral surface of the piston ring 110.

As shown in FIG. 10, the intermediate layer 112 may be directly formed on the piston ring substrate 111, or formed on the surface or wear resistance film after the nitriding treatment. The intermediate layer 112 can improve the adhesion between the piston ring substrate 111 and the coating film 101. In addition, other layers may also be arranged between the intermediate layer 112 and the coating film 101 as required to further improve the adhesion and the like. For example, a film having the same or substantially same component as the coating film 101 may be formed.

(Coating Film)

Figure 11:
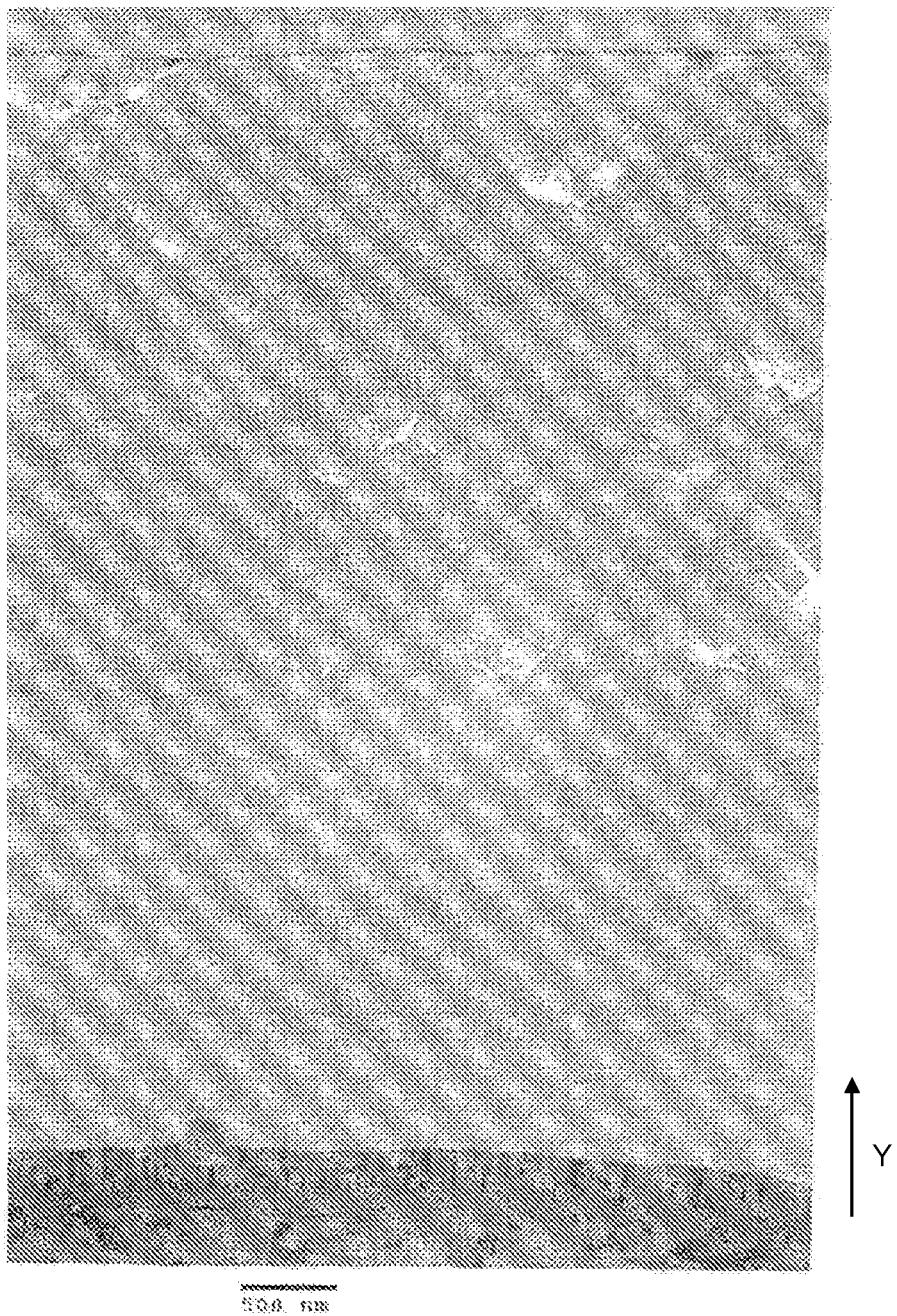
FIG. 11 is an example of a cross-sectional bright-field TEM image of a coating film in example 2-1.
Figure 12:
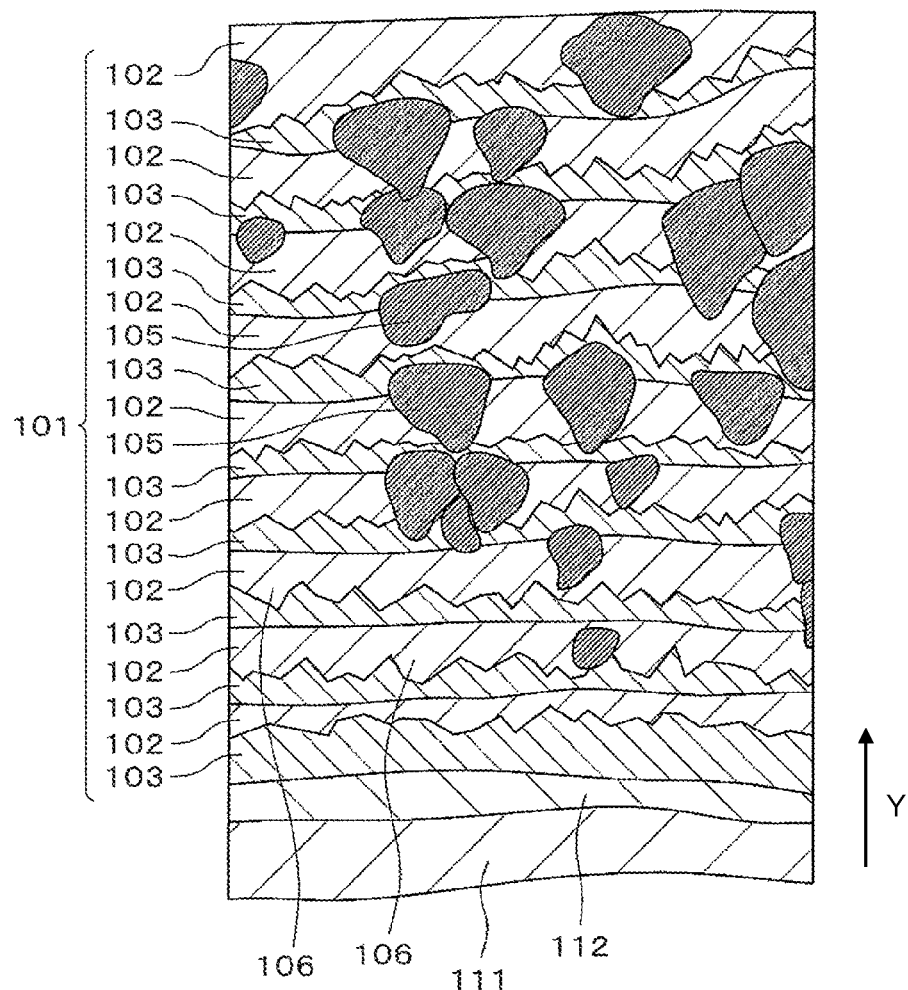
FIG. 12 is an explanatory diagram of the coating film shown in FIG. 11.

As shown in FIG. 11 and FIG. 12, the coating film 101 has two types of hard carbon layers 102, 103 shown as relatively white and black when the bright-field TEM image of the cross-section is observed, and the white hard carbon layer 102 and the black hard carbon layer 103 are alternately laminated. Moreover, in the coating film 101, the bulging part 105 crossing the interlayer of at least two laminated layers is present.

When the coating film 101 is used in the piston ring 110, as shown in FIG. 10, the coating film 101 is formed at least on the peripheral sliding surface 116 where the piston ring 110 contacts the cylinder liner (not shown) and slides. In addition, the coating film 101 may also be optionally formed on other surfaces, for example, the upper surface, lower surface and inner peripheral surface of the piston ring 110.

The relatively white hard carbon layer 102 has a great $sp^2/sp^3$ ratio. The $sp^2/sp^3$ ratio is preferably 0.4-0.9, and more preferably 0.4-0.8. The reason for the hard carbon layer 102 being seen as relatively white is that the $sp^2/sp^3$ ratio is great. By having a $sp^2/sp^3$ ratio within this range, wear resistance is insufficient, but the layer can have low density and excellent chipping resistance. In addition, $sp^2$ and $sp^3$ can be measured by TEM-EELS which combines Electron Energy Loss Spectroscopy (EELS) with Transmission Electron microscope (TEM). The black hard carbon layer 103 can be measured in the same way. Besides, low density means the density is relatively lower than the density of the relatively black hard carbon layer 103.

As shown in FIG. 11 and FIG. 12, the white hard carbon layer 102 has a three-dimensional growth shape which can be described as mesh-like, scale-like, branch-like or layer-like. This complicated growth shape becomes a shape which contains black hard carbon in the white hard carbon layer 102. As a result, even in the white hard carbon layer 102 having this growth shape, wear resistance is improved.

Moreover, the white hard carbon layer 102 having this growth shape is soft and has high graphite properties, thus is more resistant to impact than the black hard carbon layer 103, and low friction properties is excellent.

Moreover, as shown in FIG. 11 and FIG. 12, the white hard carbon layer 102 has regions that have grown in a fan-shape from the substrate 111 side toward the lamination direction Y. "Fan shape" is a fan-like shape which widens from the position of a pivot to the end. The fan-shaped growth region has organized darkness and lightness. For this reason, black hard carbon is dispersed in the gaps of the grown white hard carbon layer 102. Therefore, in the coating film 101, regions having a structure that hard carbon with different $sp^2/sp^3$ ratio are coexisted at the same position in the thickness direction are obtained, stress applied externally can be absorbed and dispersed very efficiently, and chipping resistance can be further improved.

The relatively black hard carbon layer 103 has a small $sp^2/sp^3$ ratio. The $sp^2/sp^3$ ratio is preferably 0.1-0.4, and more preferably 0.2-0.35. The reason for the hard carbon layer 103 being seen as relatively black is that the $sp^2/sp^3$ ratio is small. By having a $sp^2/sp^3$ ratio within this range, the layer can have high density and excellent wear resistance. In addition, high density means the density is relatively higher than the density of the relatively white hard carbon layer 102.

(Bulging Part)

The bulging part 105 is a characteristic part of the present invention, and as shown in FIG. 11 and FIG. 12, is present so as to cross the interlayer of at least two of the laminated layers. The "bulging part 105" is a part seen as a shape with bulged ground layer, and is a part seen as particle shape or balloon shape, in this application, it is called "bulging shape", and the part where the bulging shape is present is called the bulging part 105. Therefore, the laminating state in the case when the bulging part 105 is present is not laminated uniformly in an ordered manner in the lamination direction Y, and becomes a disordered shape. For this reason, the black hard carbon layer 103 having excellent wear resistance and the white hard carbon layer 102 having excellent chipping resistance are irregularly present in the lamination direction Y. As a result, during the process in which the coating film 101 wears as a sliding film, chipping resistance, wear resistance, and peeling resistance can be excellent.

When the coating film 101 is arranged on the peripheral sliding surface 116 of the piston ring 110, during the process in which the coating film 101 slides and wears, chipping resistance, wear resistance, and peeling resistance can be excellent.

The control of forming the bulging part 105 to what extent can be conducted by adjusting the film-forming condition. The film-forming condition may be the arc current relating to film-forming speed, vacuum degree, a distance between the cathode and the substrate. For example, by choosing film-forming conditions that increase the film-forming speed, plenty of bulging part 105 can be formed, and by choosing film-forming conditions that decrease the film-forming speed, a small amount of bulging part 105 can be formed. In addition, the forming mechanism of the bulging part 105 is not clear at present, and it is considered that it is probably because the micro-particles during the film-forming become the starting points.

In addition, the "interlayer of more than two layers" means the interlayer including at least the two layers of the white hard carbon layer 102 and the black hard carbon layer 103, either the white hard carbon layer 102 or the black hard carbon layer 103 can be the surface side, thus in the lamination direction Y, the lamination can be conducted in the sequence of the white hard carbon layer 102 and the black hard carbon layer 103, or in the sequence of the black hard carbon layer 103 and the white hard carbon layer 102. Of course, interlayers of more than 3 layers or 4 layers can be crossed. In addition, the lamination direction Y means the direction in which the coating film 101 is laminated in sequence on the substrate 111 (a direction heading toward the outermost surface side).

The bulging part 105 is present within a range of an area ratio of above 5% and below 40% when the cross-section of the coating film 101 is observed. The coating film 101 in which the bulging part 105 is present in the cross-section in this range has excellent durability that chipping resistance, wear resistance and peeling resistance are balanced. In addition, the area ratio can be calculated from a cross-section photo, and is represented by a ratio of the bulging part 105 in the cross-sectional area. When the area ratio is below 5%, there is a small amount of bulging part 105, thus the effect of the bulging part 105, that is, the disorder in the laminating state based on the bulging part 105 does not exist above a certain degree, improvement of chipping resistance, wear resistance, and peeling resistance due to this disorder cannot be achieved, and durability is not sufficiently excellent. When the area ratio is above 40%, there are plenty of bulging part 105, thus the improvement of peeling resistance based on the effect of the bulging part 105 is obtained, but wear resistance decreases, making it hard to achieve a balance, thus is not preferable.

In the bulging part 105, the area ratio is preferably greater in the upper half of the coating film 101 in the lamination direction Y than in the lower half. Because the area ratio of the bulging part 105 is greater in the upper half, chipping resistance and wear resistance on the outermost surface side of the coating film 101 can be excellent. The "upper half" is the range from the halfway in the total thickness of the coating film 101 to the outermost surface, and the "lower half" is the range from the halfway in the total thickness of the coating film 101 to the substrate side bottom surface. "Greater" means being relatively greater than the lower half in the greatness relation of area ratio.

The area ratio of the bulging part 105 is preferably above 10% and below 40% in the upper half of the coating film 101 in the lamination direction Y. Because the area ratio of the bulging part 105 in the upper half is within the above range, the disorder of the laminating state based on the bulging part 105 exists above a certain degree. As a result, peeling resistance determined by the disorder increases greatly. If the area ratio is below 10%, although peeling resistance increases, it does not increase greatly. And even when the area ratio is above 40%, the degree of improvement of peeling resistance does not change.

The bulging part 105 preferably expands toward the lamination direction Y of the coating film 101. When the bulging part 105 expands toward the lamination direction Y, the disorder degree of the layers on the outermost surface side of the coating film 101 increases. As a result, chipping resistance and wear resistance on the outermost surface side determined by the disorder can be more excellent. The degree of widening to the end may be within an angle range of 30°-90° from the pivot part. In addition, it is difficult to form a fan shape below 30° or above 90°.

The film boundary between the black hard carbon layer 103 and the white hard carbon layer 102 is not a flat surface parallel to the surface of the coating film 101, but slopes with an angle, thus even when shear stress stripping the film boundary is applied, peeling is difficult to occur, and excellent peeling resistance can be exhibited.

Regarding the thickness, the total thickness of the coating film 101 can be formed so as to be above 1 μm and below 50 μm. A thick coating film 101 within this range in which the white hard carbon layer 102 and the black hard carbon layer 103 are laminated can be formed by setting a film-forming temperature (substrate temperature) in PVD and alternating the film-forming under 200° C. and the film-forming above 200° C. The film-forming above 200° C. can form a film with a thickness above 1 μm, and obtains the white hard carbon layer 102 having a slightly greater ($sp^2/sp^3$ ratio). On the other hand, the film-forming under 200° C. obtains the black hard carbon layer 103 having a small ($sp2/sp^3$ ratio). The coating film 101 can form a thick film within the above range by alternately laminating these films. As a result, the coating film 101 which has balanced chipping resistance and wear resistance and sufficient thickness can be formed.

In addition, the thickness of each layer of the white hard carbon layer 102 can be controlled to a range of above 20 nm and below 2000 nm, and the thickness of each layer of the black hard carbon layer 103 can be controlled to a range of above 20 nm and below 1000 nm.

The coating film 101 obtained in this way is an amorphous carbon film, or an amorphous carbon film partially containing graphite, friction coefficient with respect to an object material is low, and wear resistance with respect to an object material is good.

Regarding the hard carbon film forming the coating film 101, in any one of the white hard carbon layer 102 and the black hard carbon layer 103, in addition to carbon, hydrogen may be contained in a range of above 0.1 atom % and below 10 atom %, preferably below 5 atom %. The hydrogen content can be measured by Hydrogen Forward Scattering (HFS) analysis, and preferably, the remaining part substantially contains carbon only and does not contain impurity except N, B, Si and other inevitable impurity, but for the white hard carbon layer 102, even if these elements are contained, chipping resistance can also be improved. Besides, for the black hard carbon layer 103, if the remaining part substantially contains carbon only, hardness increases and wear resistance increases, thus it is preferable. "Substantially contain carbon only" means that impurity except N, B, Si and other inevitable impurity is not contained.

(Formation of Coating Film)

Formation of the coating film 101 can use a PVD method such as arc PVD, sputter PVD, and is preferably formed by an arc ion plating which uses a carbon target and does not contain hydrogen atoms in the film-forming raw material.

When the coating film 101 is formed by arc ion plating, adjust the bias voltage or the arc current, or heat the substrate by a heater, or import a cooling mechanism to the fixture (holder) which sets the substrate to forcibly cool the substrate to control the substrate temperature, and control the furnace pressure, by which the coating film 101 is formed in which hard carbon films with different $sp^2/sp^3$ ratios (the white hard carbon layer 102 and the black hard carbon layer 103) are alternately laminated.

When forming the black hard carbon layer 103 having a $sp^2/sp^3$ ratio of 0.1-0.4, the film is formed at a substrate temperature above 50° C. and below 200° C. In order to alternately laminate the black hard carbon layer 103 with the white hard carbon layer 102, the following method can be employed which imports a cooling step after forming the white hard carbon layer 102 to decrease the substrate temperature, and forms the black hard carbon layer 103 after the substrate temperature becomes below 200° C.

When forming the white hard carbon layer 102 having a $sp^2/sp^3$ ratio of 0.4-0.9, the substrate temperature is controlled so as to be above 200° C. and below 300° C., more preferably 220° C. to 275° C. The control of the substrate temperature is preferably conducted by controlling the bias voltage to −50 V to −400 V, but the substrate temperature can also be controlled by methods such as change of the arc current, heating by a heater or cooling by a holder, applying a bias voltage intermittently such as discontinuously or pulse-like to change the voltage value. Therefore, the control is not particularly limited to the control of bias voltage only.

In addition to adjustment of bias voltage, the substrate temperature can also be adjusted by adjustment of the arc current, the heater temperature, furnace pressure and so on, and thus the bias voltage is not particularly limited; however, if the following situation is considered: it is difficult to form a mesh-shaped hard carbon film if the bias voltage is over −50 V, on the other hand, it is difficult to form a mesh-shaped hard carbon film in the case of below −400 V, the bias voltage is preferably −50 to −400 V. Besides, regarding the furnace pressure, in the case of a vacuum environment set as $10^{-4}$ Pa to $5 \times 10^{-1}$ Pa, compared with the situation where hydrogen or nitrogen is imported, a low-friction and high-wear-resistance hard carbon film can be obtained, which is thus preferred.

($sp^2/sp^3$ Ratio)

The hard carbon film is a film in which the carbon bonding $sp^2$ bonding represented by graphite and the carbon bonding $sp^3$ bonding represented by diamond are coexisted. Here, through EELS analysis (Electron Energy-Loss Spectroscopy), 1s→π* intensity and 1s→σ* intensity are measured, the 1s→π* intensity is viewed as the $sp^2$ intensity, the 1s→σ* intensity is viewed as the $sp^3$ intensity, and the ratio, that is, a ratio of 1s→π* intensity to 1s→σ* intensity is calculated as the $sp^2/sp^3$ ratio. Accordingly, the $sp^2/sp^3$ ratio in the present invention is actually the ratio of π/σ intensity. Specifically, with a spectral imaging method in a STEM (scanning TEM) mode, under a condition of an acceleration voltage of 200 kv, a sample absorption current of $10^{-9}$ A, and a beam spot size of φ 1 nm, EELS obtained at an interval of 1 nm is accumulated, to extract a C-K absorption spectrum in the form of average information from a region of about 10 nm, and the $sp^2/sp^3$ ratio is calculated. In addition, the covalent bonding ratio can be measured by an EELS analysis device (manufactured by Gatan, Model863GIF Tridiem). The measurement can be conducted in the sequence described in the example below.

Example

In the following part, the coating film and piston ring of the present invention are described in further detail by listing examples and reference examples.

Example 2-1

The piston ring substrate 111 (diameter 80 mm, ring radial direction width 2.6 mm, ring width direction width 1.2 mm) corresponding to SWOSC-V material in the JIS standard is used, which contains C: 0.55 mass %, Si: 1.35 mass %, Mn: 0.65 mass %, Cr: 0.70 mass %, Cu: 0.03 mass %, P: 0.02 mass %, S: 0.02 mass %, remaining part: iron and inevitable impurity, and on the piston ring substrate 111, a metal chrome layer with a thickness of 0.2 μm is formed as the intermediate layer 112 by ion plating.

Next, on the intermediate layer 112, the coating film 101 is formed using an arc ion plating device using a carbon target. Specifically, regarding the temperature condition during film-forming, after arc discharge is carried out at a bias voltage of −700 V and an arc current of 40 A for 10 minutes, arc discharge is carried out at a bias voltage of −170 V and an arc current of 40 A to increase temperature for 2500 seconds while heater heating is carried out from 50° C. to 245° C., and the black hard carbon layer 103 and the white hard carbon layer 102 with a total film thickness of about 0.6 μm are formed. Then, arc discharge is stopped at a bias voltage of 0 V and an arc current of 0 A to cool to 125° C. for 3600 seconds. After that, arc discharge is carried out for 90 seconds at a bias voltage of −1000 V and an arc current of 40 A to form an adhesion layer (not shown) containing white hard carbon, then arc discharge is carried out again at a bias voltage of −170 V and an arc current of 40 A to increase temperature for 2500 seconds while heater heating is carried out from 125° C. to 245° C., and the black hard carbon layer 103 and the white hard carbon layer 102 with a total film thickness of about 0.6 μm are formed; the repeating cycle of temperature increase and temperature decrease is carried out 8 times to form the coating film 101 with a total film thickness of about 5.7 μm. In this way, the piston ring of the example 2-1 is manufactured.

For the formed coating film 101, the bright-field TEM image of the cross-section is taken. As shown in FIG. 11, it can be confirmed that in the coating film 101, the white hard carbon layer 102 shown as relatively white and the black hard carbon layer 103 shown as relatively black are alternately laminated in the thickness direction. The $sp^2/sp^3$ ratio of the white hard carbon layer 102 is 0.7, and the $sp^2/sp^3$ ratio of the black hard carbon layer 103 is 0.3.

Among the laminated multiple layers, the bulging part 105 crossing the interlayer can be confirmed. Plenty of bulging parts 105 can be seen, some cross 2 layers, and the ones crossing 3 layers, 4 layers or more can also be confirmed. It can be confirmed that the bulging part 105 expands toward the lamination direction Y of the coating film 101. Regarding the confirmation of the area ratio of the bulging part 105, capture the photo in an image, paint the bulging part 105 including the fan shape into black, determine a threshold so that other parts can be judged as white, and use an image analyzing device to calculate the area of the black part. The area ratio of the coating film 101 in lower half of the lamination direction Y is 6.0%, and in the upper half is 14.0%, the upper half being greater than the lower half. The area ratio of the bulging part 105 to the cross-section of the coating film 101 is 10.0%. Besides, it can be confirmed that, in the white hard carbon layer 102, there are regions that have grown in a fan-shape from the substrate side toward the lamination direction Y, moreover, it can also be confirmed that there are three-dimensional growth shapes which can be described as mesh-like, scale-like, branch-like or layer-like.

Example 2-2

Change the arc current among the film-forming conditions of the coating film 101 in the example 2-1 to 50 A. Apart from that, similar to the example 2-1, the piston ring of the example 2-2 which has the coating film 101 with a total film thickness of about 5.7 μm is manufactured.

For the formed coating film 101, the bright-field TEM image of the cross-section is taken. Similar to the case of the example 2-1, it can be confirmed that in the coating film 101, the white hard carbon layer 102 shown as relatively white and the black hard carbon layer 103 shown as relatively black are alternately laminated in the thickness direction. The $sp^2/sp^3$ ratio of the white hard carbon layer 102 is 0.7, and the $sp^2/sp^3$ ratio of the black hard carbon layer 103 is 0.3.

Similar to the case of example 2-1, among the laminated multiple layers, the bulging part 105 crossing the interlayer can be confirmed. Plenty of bulging parts 105 which are larger than those in the case of the example 2-1 can be seen, and there are many bulging parts 105 crossing 2 layers or 3 layers. The bulging part 105 expands toward the lamination direction Y of the coating film 101. The area ratio of the bulging part 105 in the coating film 101 in the lower half of the lamination direction Y is 10.7% and 34.7% in the upper half, the upper half being greater than the lower half. The area ratio of the bulging part 105 to the whole cross-section of the coating film 101 is 22.7%. Besides, it can be confirmed that, in the white hard carbon layer 102, there are regions that have grown in a fan shape from the substrate side toward the lamination direction Y, moreover, three-dimensional growth shapes which can be described as mesh-like, scale-like, branch-like or layer-like can also be confirmed.

Reference Example 2-1

Regarding the film-forming conditions of the coating film in example 2-1, the arc current is decreased to suppress the film-forming speed and form the film under the condition that the formation of the bulging part 105 is avoided as far as possible; apart from that, similar to the example 2-1, the piston ring of the reference example 2-1 which has a coating film with a total film thickness of 5.7 μm is manufactured.

For the formed coating film 101, the bright-field TEM image of the cross-section is taken. Similar to the case of the example 2-1, it can be confirmed that, in the coating film 101, the white hard carbon layer 102 shown as relatively white and the black hard carbon layer 103 shown as relatively black are alternately laminated in the thickness direction. The $sp^2/sp^3$ ratio of the white hard carbon layer 102 is 0.7, and the $sp^2/sp^3$ ratio of the black hard carbon layer 103 is 0.3. On the other hand, different from the case of the example 2-1 and 2-2, among the laminated multiple layers, the bulging part 105 crossing the interlayer cannot be confirmed. However, similar to the case of the example 2-1, it can be confirmed that, in the white hard carbon layer 102, there are regions that have grown in a fan shape from the substrate side toward the lamination direction Y, moreover, three-dimensional growth shapes which can be described as mesh-like, scale-like, branch-like or layer-like can also be confirmed.

[Observation of the Structure Shape]

The cross-section photos of the coating film 101 of the example 2-1, 2-2 and the reference example 2-1 is obtained by taking a photo of the cross-section of the coating film 101 by a bright-field TEM at an acceleration voltage of 200-300 kv, besides, the total thickness of the coating film 101, the thickness of the white hard carbon layer 102 or the black hard carbon layer 103 are calculated from the bright-field TEM image.

[Wear Resistance, Chipping Resistance, Low Friction Properties, Peeling Resistance]

Figure 13:
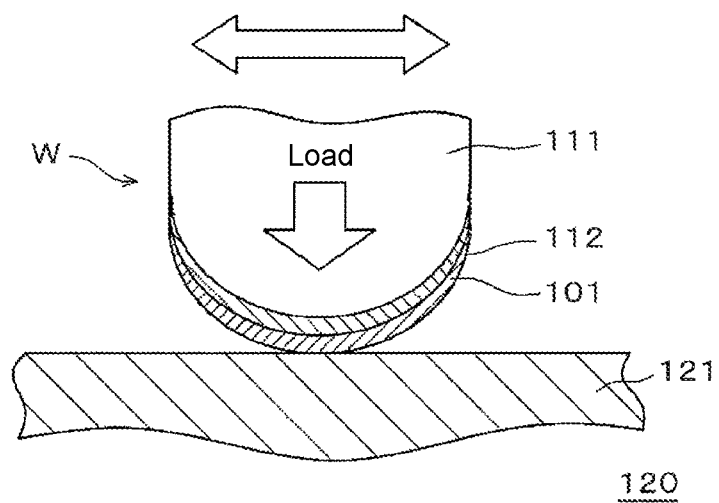
FIG. 13 is a schematic diagram of a friction-wear testing method using an SRV experiment machine.

Various characteristics of the formed coating film 101 are obtained by a friction-wear testing method 120 using a SRV (Schwingungs Reihungund and Verschleiss) experiment machine commonly used in the evaluation of sliding members for automobile. Specifically, as shown in FIG. 13, in the state that the sliding surface of the friction-wear testing sample W contacts with SUJ2 material which is a sliding object 121, use 5W-30 (Mo-DTC free) for the lubricant oil and apply a load of 1000 N, slide back and forth for 60 minutes under the load and observe the sliding surface of the friction-wear testing sample W by a microscope. In FIG. 13, the symbol 112 is an intermediate layer, and the symbol 101 is a coating film. Chipping resistance and peeling resistance of the coating film 101 is evaluated according to the observation result. Wear resistance is evaluated from wear depth, and low friction properties are compared by measuring the friction coefficient value. The evaluation result is shown in Table 9.

(Wear Resistance)

It is evaluated as "excellent" when the total wear amount is within ¼ of the total film thickness, as "good" when over ¼ but below ½, as "qualified" when the base is not exposed and the wear amount is above ½ of the total film thickness, and as "unqualified" when the wear amount is above the total film thickness and the base is exposed.

(Chipping Resistance)

It is evaluated as "excellent" when there is no chipping, as "good" when there are 1-4 points of tiny chipping, as "qualified" when there is more than 5 tiny chipping, and as "unqualified" when the chipping is above 0.05 mm.

(Peeling Resistance)

It is evaluated as "excellent" when there is no peeling, as "good" when the total peeling amount is within ⅛ of the total sliding area, as "qualified" when within ¼ and as "unqualified" when the peeling is over ¼.

[Result]

The result is summarized in Table 9 below. As seen from Table 9, it can be confirmed that the coating film 101 of the example 2-1, 2-2 has excellent property regarding wear resistance, chipping resistance, low friction properties and peeling resistance.

TABLE 9

|  | Example 2-1 | Example 2-2 | Reference example 2-1 |
| --- | --- | --- | --- |
| Wear resistance | Excellent | Excellent | Excellent |
| Chipping resistance | Excellent | Excellent | Qualified |
| Low friction properties | 0.06 | 0.06 | 0.09 |
| Peeling resistance | Excellent | Excellent | Qualified |

It is seen from the above result that the piston ring 110 of the example 2-1 and 2-2 has a coating film which has excellent durability that chipping resistance, wear resistance and peeling resistance are balanced. On the other hand, regarding the piston ring of the reference example 2-1, the bulging part 105 is not confirmed, peeling resistance and the like decrease, so the piston ring does not have a coating film which has excellent durability that chipping resistance, wear resistance and peeling resistance are balanced. It is considered that the reason for the degeneration of peeling resistance may be that effect of the disordered shape is not obtained because the bulging part 105 is not present.

The above describes the present invention according to implementation forms, but the present invention is not limited to the implementation forms. Various changes can be made to the implementation forms within the same and equivalent scopes of the present invention.

What is claimed is:

1. A coating film, coated on a substrate surface, wherein when a cross-section is observed through a bright-field TEM image, white hard carbon layers shown as relatively white and black hard carbon layers shown as black are alternately laminated in a thickness direction to have a total film thickness ranging from 1 μm to 50 μm, and the white hard carbon layers have regions that have grown in a fan shape in the thickness direction.

2. The coating film according to claim 1, further comprising an adhesion layer comprising relatively-white hard carbon between the white hard carbon layer shown as relatively white and the black hard carbon layer shown as black when the cross-section is observed through the bright-field TEM image.

3. The coating film according to claim 2, wherein a $sp^2/sp^3$ ratio of the adhesion layer comprising the white hard carbon is 0.4-0.9.

4. The coating film according to claim 1, wherein a $sp^2/sp^3$ ratio of the black hard carbon layer is 0.1-0.4.

5. The coating film according to claim 1, wherein a $sp^2/sp^3$ ratio of the white hard carbon layer is 0.4-0.9.

6. The coating film according claim 1, wherein when electron beam diffraction is performed to the white hard carbon layers, diffraction spots are shown at positions with a lattice spacing of 0.3-0.4 nm.

7. The coating film according to claim 1, wherein a thickness of each layer of the white hard carbon layers is 20-2000 nm, and a thickness of each layer of the black hard carbon layers is 20-1000 nm.

8. The coating film according to claim 1, wherein a ratio of the thickness of the white hard carbon layer to the thickness of the black hard carbon layer changes in the thickness direction of the coating film, and increases from the substrate side toward the surface side.

9. The coating film according to claim 1, wherein the white hard carbon layers have organized darkness and lightness when the cross-section is observed through the bright-field TEM image.

10. The coating film according to claim 1, wherein a hydrogen content of the black and/or the white hard carbon layers is below 10 atom %.

11. The coating film according to claim 1, wherein at least one layer of the white hard carbon layers exists in a region within a depth of 1 μm from the surface, and the $sp^2/sp^3$ ratio of the white hard carbon layer is above 0.5.

12. The coating film according to claim 1, wherein an outermost surface is the white hard carbon layer.

13. The coating film according to claim 1, wherein a nano indentation hardness of the black hard carbon layers is 30-80 GPa.

14. The coating film according to claim 13, wherein a nano indentation hardness of the white hard carbon layers is 10-30 GPa.

15. The coating film according to claim 1, which is a coating film coated on a substrate surface, wherein when the cross-section is observed through bright-field TEM image, the white hard carbon layers shown as relatively white and the black hard carbon layers shown as relatively black are alternately laminated in the thickness direction, and a bulging part crossing an interlayer of at least two of the laminated layers is present.

16. The coating film according to claim 15, wherein the bulging part is present in a manner that an area ratio when observing the cross-section of the coating film is within a range above 5% and below 40%.

17. The coating film according to claim 15, wherein in the bulging part, the area ratio is greater in an upper half in a lamination direction of the coating film than in a lower half.

18. The coating film according to claim 15, wherein the bulging part expand toward a lamination direction of the coating film.

19. The coating film according to claim 15, wherein the white hard carbon layers have regions that have grown in a fan shape towards a lamination direction.

20. The coating film according claim 15, wherein the white hard carbon layers have growth shapes which can be described as mesh-shaped, scale-like, branch-like or layer-like.

21. The coating film according to claim 15, wherein a $sp^2/sp^3$ ratio of the white hard carbon layer is 0.4-0.9, and a $sp^2/sp^3$ ratio of the black hard carbon layer is 0.1-0.4.

22. A piston ring, which comprises the coating film according to claim 15 on at least a peripheral sliding surface.

* * * * *